US012813240B2

(12) United States Patent
Hiblot et al.

(10) Patent No.: US 12,813,240 B2
(45) Date of Patent: Nov. 24, 2026

(54) INTEGRATED CIRCUIT DEVICES AND METHODS FOR MAKING SUCH DEVICES

(71) Applicant: IMEC VZW, Leuven (BE)

(72) Inventors: Gaspard Hiblot, Leuven (BE); Boon Teik Chan, Wilsele (BE); Gioele Mirabelli, Leuven (BE)

(73) Assignee: Imec vzw, Leuven (BE)

( * ) Notice: Subject to any disclaimer, the term of this patent is extended or adjusted under 35 U.S.C. 154(b) by 482 days.

(21) Appl. No.: 18/514,753

(22) Filed: Nov. 20, 2023

(65) Prior Publication Data

US 2024/0213312 A1 Jun. 27, 2024

(30) Foreign Application Priority Data

Dec. 23, 2022 (EP) .................................... 22216344

(51) Int. Cl.
*H01L 29/06* (2006.01)
*H01L 21/8234* (2006.01)
(Continued)

(52) U.S. Cl.
CPC ........ *H10W 20/069* (2026.01); *H10D 30/014* (2025.01); *H10D 30/0198* (2025.01);
(Continued)

(58) Field of Classification Search
CPC ........... H10W 20/069; H10W 20/0696; H10W 20/076; H10W 20/481
See application file for complete search history.

(56) References Cited

U.S. PATENT DOCUMENTS 10,586,765 B2 3/2020 Smith et al.
10,734,412 B2 8/2020 Glass et al.
(Continued)

FOREIGN PATENT DOCUMENTS

CN 115132774 A 9/2022
EP 4 002 452 A1 5/2022

OTHER PUBLICATIONS

Extended European Search Report dated Jun. 22, 2023, issued in European Patent Application No. 22216344.6, 9 pages.
(Continued)

*Primary Examiner* — Victoria K. Hall
(74) *Attorney, Agent, or Firm* — McDonnell Boehnen Hulbert & Berghoff LLP

(57) ABSTRACT

An integrated circuit device and method for forming the integrated circuit device are provided. The method includes: a) forming a semiconductor device on a frontside of a substrate comprising: a device layer on the frontside of the substrate, the device layer comprising a first active device, the substrate comprising: shallow trench isolation structures and a via filled with a sacrificial plug extending through the substrate material in a first separating portion; b) removing the substrate material from a backside of the substrate; c) depositing a liner covering the backside of the substrate; d) anisotropically etching the liner so as to expose a first end of the sacrificial plug, while retaining at least part of the liner in the separating portions; e) removing the sacrificial plug selectively with respect to the liner; and f) providing an electrically conductive material in the via, electrically coupled to a buried power rail.

16 Claims, 11 Drawing Sheets

(51) Int. Cl.

| | |
|---|---|
| ***H01L 27/088*** | (2006.01) |
| ***H01L 29/08*** | (2006.01) |
| ***H01L 29/423*** | (2006.01) |
| ***H01L 29/66*** | (2006.01) |
| ***H01L 29/775*** | (2006.01) |
| ***H01L 29/786*** | (2006.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 64/01*** | (2025.01) |
| ***H10D 64/23*** | (2025.01) |
| ***H10D 84/01*** | (2025.01) |
| ***H10D 84/03*** | (2025.01) |
| ***H10D 84/83*** | (2025.01) |
| ***H10W 20/00*** | (2026.01) |
| ***H10W 20/20*** | (2026.01) |
| ***H10W 20/40*** | (2026.01) |
| ***H10W 20/41*** | (2026.01) |
| *B82Y 10/00* | (2011.01) |

(52) U.S. Cl.

CPC ......... *H10D 30/43* (2025.01); *H10D 30/6735* (2025.01); *H10D 30/6757* (2025.01); *H10D 62/115* (2025.01); *H10D 62/121* (2025.01); *H10D 62/151* (2025.01); *H10D 64/017* (2025.01); *H10D 64/251* (2025.01); *H10D 84/013* (2025.01); *H10D 84/0149* (2025.01); *H10D 84/0151* (2025.01); *H10D 84/0186* (2025.01); *H10D 84/038* (2025.01); *H10D 84/83* (2025.01); *H10W 20/0696* (2026.01); *H10W 20/20* (2026.01); *H10W 20/427* (2026.01); *H10W 20/481* (2026.01); *B82Y 10/00* (2013.01); *H10W 20/076* (2026.01)

(56) References Cited

U.S. PATENT DOCUMENTS

| | | | | |
|---|---|---|---|---|
| 10,886,217 | B2 | 1/2021 | Morrow et al. | |
| 11,222,892 | B2 | 1/2022 | Su et al. | |
| 11,239,325 | B2 * | 2/2022 | Huang | H10D 64/01 |
| 11,264,327 | B2 | 3/2022 | Chiang et al. | |
| 11,289,606 | B2 | 3/2022 | Ju et al. | |
| 11,652,043 | B2 * | 5/2023 | Wang | H10D 84/0149 257/368 |
| 11,664,374 | B2 * | 5/2023 | Chung | H10D 84/0186 257/365 |
| 11,984,401 | B2 * | 5/2024 | Xie | H10D 64/017 |
| 12,424,539 | B2 * | 9/2025 | Xie | H10D 84/0149 |
| 12,484,296 | B2 * | 11/2025 | Katakam | H10D 84/85 |
| 12,575,160 | B2 * | 3/2026 | Xie | H10D 30/014 |
| 12,690,443 | B2 * | 7/2026 | Xie | H10W 20/427 |
| 2020/0266169 | A1 | 8/2020 | Kang et al. | |
| 2021/0336019 | A1 * | 10/2021 | Su | H10D 64/017 |
| 2021/0343639 | A1 * | 11/2021 | Wang | H10D 84/0149 |
| 2021/0366907 | A1 * | 11/2021 | Liao | H10D 84/853 |
| 2021/0408247 | A1 | 12/2021 | Yu et al. | |
| 2022/0165856 | A1 * | 5/2022 | Yu | H10D 30/6729 |
| 2022/0238660 | A1 | 7/2022 | Huang et al. | |
| 2022/0310455 | A1 | 9/2022 | Huang et al. | |
| 2022/0336287 | A1 * | 10/2022 | Yu | H10D 84/0158 |
| 2022/0359679 | A1 * | 11/2022 | Lu | H10D 30/6729 |
| 2022/0367454 | A1 * | 11/2022 | Chung | H10D 84/0149 |
| 2023/0083432 | A1 * | 3/2023 | Cheng | H10D 84/0158 257/213 |
| 2023/0268389 | A1 * | 8/2023 | Jain | H10D 62/118 257/288 |
| 2023/0326858 | A1 * | 10/2023 | Ham | H10W 20/069 |
| 2023/0369401 | A1 * | 11/2023 | Huang | H10D 30/43 |
| 2023/0402379 | A1 * | 12/2023 | Li | H10W 20/427 |
| 2024/0088034 | A1 * | 3/2024 | Kang | H10P 90/1906 |
| 2024/0204067 | A1 * | 6/2024 | Xie | H10D 30/6735 |
| 2024/0290660 | A1 * | 8/2024 | Chan | H10D 84/038 |
| 2024/0395900 | A1 * | 11/2024 | Yun | H10D 64/017 |
| 2024/0404950 | A1 * | 12/2024 | Xie | H10D 30/014 |
| 2025/0169172 | A1 * | 5/2025 | Zou | H10D 84/85 |
| 2025/0169177 | A1 * | 5/2025 | Kang | H10D 84/0149 |

OTHER PUBLICATIONS

Disclosed Anonymously, "Method and Structure for Implementing Replacement/Buried Power Rail in VTFET," ip.com, IPCOM000260354D, pp. 1-6 (2019).

Disclosed Anonymously, "Self-Aligned Buried Contact to Buried Power Rail with WAC," ip.com, IPCOM000259609D, pp. 1-8 (2019).

* cited by examiner

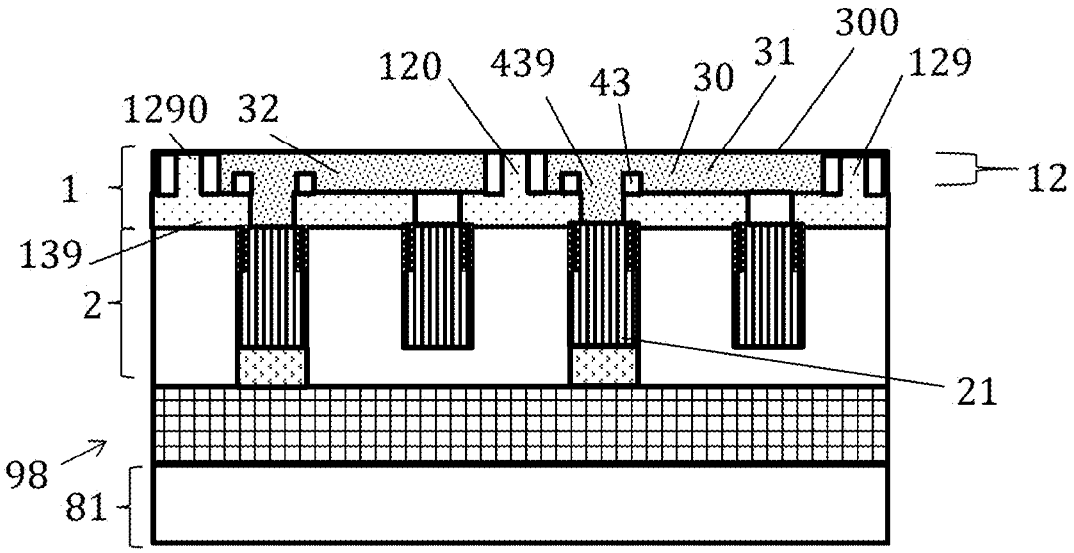

Fig. 16 a. forming (901) a semiconductor device on a frontside of a substrate

↓ b. removing (902) the substrate material from a backside of the substrate

↓ c. depositing (903) a liner covering the backside of the substrate

↓ d. anisotropically etching (904) the liner so as to expose a first end of the sacrificial plug

↓ e. removing (905) the sacrificial plug selectively with respect to the liner

↓ f. providing (906) an electrically conductive material in the via, and electrically coupling the electrically conductive material in the via to a buried power rail

Fig. 17

INTEGRATED CIRCUIT DEVICES AND METHODS FOR MAKING SUCH DEVICES

CROSS-REFERENCE

The present application claims priority from European Patent application no. 22216344.6, filed on Dec. 23, 2022 which is incorporated by reference in its entirety.

TECHNICAL FIELD OF THE PRESENT DISCLOSURE

The present disclosure relates to the field of integrated circuit devices. More specifically, the present disclosure relates to integrated circuit devices comprising buried power rails, and methods for forming such integrated circuit devices.

BACKGROUND OF THE PRESENT DISCLOSURE

The field of semiconductor devices continuously evolves to further increase the density of semiconductor devices in the device layer of an integrated circuit device. Typically, an interconnect layer comprising electrical interconnects interconnecting the different semiconductor devices in the device layer, is formed during back-end-of-line processing on the top side of the device layer. However, due to the increasing density of semiconductor devices, manufacturing these electrical interconnects has become increasingly challenging.

A solution known in the state of the art is the use of buried power rails. These buried power rails are located below the device layer, i.e., on the side of the device layer opposite to that where the interconnect layer is located. The buried power rails may provide power to the semiconductor devices. By moving at least part of the power lines powering the semiconductor devices from the interconnect layer to below, i.e., to the back of the device layer, more freedom of manufacturing may be achieved. Furthermore, the distance between the buried power rails and the semiconductor devices may be smaller than between interconnects in the interconnect layer and the semiconductor devices, which may result in a reduction of resistive losses.

However, in the state of the art, alignment between the buried power rails and the vias remains an issue, in particular due to wafer deformation that may occur, for example, during wafer bonding. Furthermore, methods of the state of the art for forming the buried power rails and the vias connecting the buried power rails to the semiconductor devices are often tedious and manufacturing-intensive.

There is thus still a need in the art for devices and methods that address at least some of the above problems.

SUMMARY OF THE PRESENT DISCLOSURE

It is an object of the present disclosure to provide integrated circuit devices comprising buried power rails and methods for forming such devices or parts thereof, solving one or more of the problems present in the state of the art.

The above objective is accomplished by a method and device according to embodiments of the present disclosure. It is a benefit of embodiments of the present disclosure that the integrated circuit device may comprise a buried power rail self-aligned to a via.

It is a benefit of embodiments of the present disclosure that said self-alignment may be obtained by techniques that are compatible with known manufacturing routes for manufacturing integrated circuit devices.

It is a benefit of embodiments of the present disclosure that the active device formation during frontside processing may be decoupled, i.e. proceed independently to, the fabrication of backside wiring lines, i.e., buried power rails. The frontside processing may thus be completed prior to forming the buried power rails. In a traditional scheme where the buried power rail is formed during frontside processing, prior to active device formation, there is a risk for metal contamination due to the presence of the buried power rail during the active device formation. The backside processing of the present method can mitigate this risk.

In a first aspect, the present disclosure relates to a method for forming an integrated circuit device. The method comprises step a) comprising forming a semiconductor device on a frontside of a substrate, the semiconductor device comprising a device layer on the frontside of the substrate, the device layer comprising a first active device. The semiconductor device further comprises a frontside interconnect layer on a frontside of the device layer, facing away from the substrate. The substrate comprises a plurality of shallow trench isolation structures embedded in a substrate material in a first section of the substrate, wherein adjacent shallow trench isolation structures are separated from each other by a separating portion comprising the substrate material. The substrate further comprises at least part of a via filled with a sacrificial plug extending through the substrate material in a first separating portion separating adjacent shallow trench isolation structures. The sacrificial plug contacts a source or drain contact of the first active device. The method comprises a step b), after step a), comprising, subsequent to forming the semiconductor device, removing the substrate material from a backside of the substrate, thereby exposing the sacrificial plug and the shallow trench isolation structures, and from the separating portions between the adjacent shallow trench isolation structures. The method comprises a step c), after step b), comprising depositing a liner covering the backside of the substrate, thereby covering the sacrificial plug and surfaces of the separating portions, covering exposed surfaces of the device layer facing to the separating portions, exposed by said removing of the substrate material. The method comprises a step d), after step c), comprising anisotropically etching the liner so as to expose a first end of the sacrificial plug, while retaining at least part of the liner in the separating portions between adjacent shallow trench isolation structures covering the surfaces of the device layer facing the separating portions. The method comprises a step e), after step d), comprising removing the sacrificial plug selectively with respect to the liner, thereby exposing the source or drain contact of the first active device. The method comprises a step f), after step e), comprising providing an electrically conductive material in the via, electrically contacting the source or drain contact of the first active device. The electrically conductive material in the via is electrically coupled to a buried power rail.

It is a benefit of embodiments of the present disclosure that the liner may fill the separating portions, thereby preventing electrical coupling between the deposited electrically conductive material and parts of the first active device different from the source or drain region, and any other source or drain contacts of active devices in the device layer that are generally not to be contacted by the electrically conductive material. For example, the liner may prevent a direct electrical contact between the bottom of a channel of the active device and the electrically conductive material.

In embodiments, the sacrificial plug extends farther into the substrate than the adjacent shallow trench isolation structures separated by the first separating portion, farther in a direction from the frontside to the backside of the substrate. In these embodiments, the first end of the sacrificial plug may be located in a second section of the substrate, contiguous to the first section and at a side of the first section facing the backside of the substrate.

In embodiments, the substrate in step a) comprises at least one extended shallow trench isolation structure embedded in the substrate material in the second section of the substrate, contiguous to the first section and at a side of the first section facing the backside of the substrate, each extended shallow trench isolation structure extending from a first end, facing the backside of the substrate, of one of the shallow trench isolation structures, wherein the at least one extended shallow trench isolation structure separates the second section in a plurality of regions comprising the substrate material, wherein each separating portion between adjacent shallow trench isolation structures is located over one of the plurality of regions. In these embodiments, in step b), the substrate material is removed from the second section of the substrate, exposing the at least one extended shallow trench isolation structure, wherein, in step f), the electrically conductive material is further provided in the plurality of regions, thereby forming a plurality of buried power rails. Herein, the buried power rails are separated from each other by the extended shallow trench isolation structures. It is a benefit of these embodiments that buried power rails may be formed during the backside processing between the extended shallow trench isolation structures that may be self-aligned with any vias between the shallow trench isolation structures.

Step a) of forming the semiconductor device on the frontside of the substrate typically comprises forming the plurality of shallow trench isolation structures and the sacrificial plug in the substrate, which may be performed before or after forming features of the device layer. For example, nanosheet channels may be formed before forming the plurality of shallow trench isolation structures and the sacrificial plug, and the source of drain contact of the first active device may be formed thereafter. However, the present disclosure is not limited thereto, and another order of forming these different features may be applied.

Forming the semiconductor device typically comprises first forming the device layer and subsequently forming the frontside interconnect layer on the device layer. Forming the frontside interconnect layer may conclude the frontside processing of the method. After forming the semiconductor device and before step b), the structure, comprising the substrate and the semiconductor device, is flipped and bonded to a carrier wafer, with the frontside of the substrate facing the carrier wafer, i.e., wherein the carrier wafer is bonded onto the frontside interconnect structure. Any suitable industry standard bonding technique may be used for this purpose. The substrate is subsequently thinned from the backside, that is, by removing the substrate material, to expose the sacrificial plug and the shallow trench isolation structures. The thinning process may comprise one or more of grinding, chemical mechanical polishing and/or etch back. The steps after the frontside processing of step a) are typically performed by backside processing.

In embodiments, in step a), the at least one farther shallow trench isolation structure extends farther into the substrate than the sacrificial plug, farther in a direction from the frontside to the backside of the substrate. In other words, in embodiments, a first end of the at least one extended shallow trench isolation structure, facing the backside of the substrate, is farther separated from the frontside of the substrate than a first end of the sacrificial plug. In embodiments, step b) comprises selectively etching the substrate material, selectively with respect to the sacrificial plug.

In embodiments, the liner comprises a dielectric material, such as $SiO_2$ or SiN. The liner may, for example, be deposited using atomic layer deposition.

In embodiments, the sacrificial plug may be formed of SiN, $SiO_2$, SiC, $AlO_x$, or SiGe. In embodiments, the sacrificial plug may comprise a dual material, i.e., two materials. For example, the sacrificial material may comprise a SiN liner covering surfaces of the via and surrounding a central portion comprising $SiO_2$. Step e) comprises selectively removing the sacrificial plug with respect to the liner. As such, the sacrificial plug is formed of a different material than the liner. In embodiments wherein the sacrificial plug is formed of a dielectric material such as SiN or $SiO_2$, the selective removal may be achieved using fluorine, or a hydro-carbo-fluoride etchant, such as $CF_4$ or $CH_3F$. In embodiments wherein the sacrificial plug is formed of $Al_2O_3$, the selective removal may be achieved using chlorine based etching, i.e., using an etchant comprising chlorine, i.e., $Cl_2$. In embodiments wherein the sacrificial plug comprises SiGe, the selective removal may be achieved using HBr, fluorine or $Cl_2$ as an etchant.

In embodiments, the substrate material may be a semiconductor material, such as crystalline silicon, crystalline germanium or crystalline germanium arsenide.

In embodiments, step e) of removing the sacrificial plug selectively with respect to the liner may be performed so as to form a template around the via at least partially covering sides, different from the first end, of the sacrificial plug and having an opening at the first end of the sacrificial plug. In embodiments, the sides of the sacrificial plug that are partially covered by the liner are surfaces different from the first end of the plug, and that were exposed after step b) of removing the substrate material. In these embodiments, depositing the electrically conductive material in the via in step f) comprises depositing the electrically conductive material in the template.

Typically, the liner is deposited as a uniform layer of a dielectric material. Typically, step c) comprises covering, with the liner, the first end and any sides of the sacrificial plug that were exposed by removing the substrate material in step b). In some embodiments, in step a), part of the sacrificial plug protrudes from the first section, i.e., from the first separating portion comprising the substrate material between the first pair of adjacent shallow trench isolation structures, in which the at least part of the via is located, farther into the substrate, farther in a direction from the frontside to the backside of the substrate, than the shallow trench isolation structures, e.g., into the second section of the substrate. In embodiments, the liner is deposited such that the liner, at the first end of the sacrificial plug, has a thickness, in a direction from the frontside of the substrate to the backside of the substrate, that is smaller, e.g., at least 10%, generally at least 50%, smaller, than a length, in said direction, of the protruding part of the sacrificial plug.

In embodiments, in the entity obtained in step a), the device layer comprises a second active device, wherein a source or drain contact of the second active device overlaps with a second separating portion between adjacent shallow trench isolation structures. The first and second separating portion may be the same or different. The source or drain contact of the second active device contacts the substrate material in the second separating portion. In these embodiments, in step b), the substrate material is removed from the backside of the substrate, from said second separating portion between adjacent shallow trench isolation structures, thereby exposing the source or drain contact of the second active device. It is a benefit of these embodiments that a parasitic contact, or channel, formed by the substrate material in the second separating portion, contacting the source or drain contact of the second active device, may be removed. In these embodiments, in step c), the liner is deposited filling the second separating portion. Thereby, the liner covers the exposed source or drain contact of the second active device. In these embodiments, in step d), the anisotropically etching the liner is performed such that the source or drain contact of the second active device remains covered by the liner.

In some embodiments, the liner deposited in step c) has a thickness, e.g., mean thickness, which may be in a direction from the backside of the substrate to the frontside of the substrate at the first end of the sacrificial plug, that is at least as large as, usually larger than, half of a distance, e.g., mean distance, separating adjacent shallow trench isolation structures, e.g., larger than half of a width, e.g., mean width, of the first separating portion and, if present, the second separating portion, in a direction from a first to a second of the adjacent shallow trench isolation structures separated by said first or second separating portion. In these embodiments, the thickness of the liner may range from 3 nm to 50 nm, for example, from 5 nm to 20 nm. It is a benefit of these embodiments that the liner may completely fill the separating portions. It is a benefit of these embodiments that the liner may be straightforwardly removed from the first end of the sacrificial plug without completely removing the liner material from the separating portions, so that the liner still covers the surfaces of the device layer facing the separating portions, when stopping said anisotropic etching once the first end of the sacrificial plug is exposed.

The thickness of the liner being at least as large as half of a distance separating the adjacent shallow trench isolation structures is, however, not essential. In different embodiments, the liner deposited in step c) has a thickness that is smaller than half of a distance separating adjacent shallow trench isolation structures. In these embodiments, the deposited liner may comprises recesses overlapping with the separating portions. In these embodiments, after depositing the liner, a further dielectric material may be deposited filling the recesses in the liner overlapping with the separating portions. In these embodiments, the liner may comprise SiN, and the further dielectric material may be $SiO_2$ or SiOC. In these embodiments, anisotropically etching the liner typically also comprises etching the further dielectric material. Also in these embodiments, the first end of the sacrificial plug may be exposed without exposing the surfaces of the device layer facing the separating portions. In embodiments, the anisotropically etching the liner may be formed using any known technique, for example, using a plasma etch.

In embodiments, after removing the sacrificial plug, an etch-back may be performed on the exposed source or drain contact of the first active device. This may result in a lower contact resistivity between the source or drain contact and the electrically conductive material subsequently deposited in step f).

In embodiments, step a) of forming the semiconductor device on the frontside of the substrate comprises forming the plurality of shallow trench isolation structures in the substrate by: a1) forming a plurality of trenches through the frontside of the substrate; and a2) depositing an electrically insulating material in the trenches, thereby forming the plurality of shallow trench isolation structures. In embodiments comprising the extended shallow trench isolation structures, step a) further comprises, between step a1) and step a2), step a1') comprising: forming at least one extended trench, each through a first end of one of the plurality of shallow trenches, facing the backside of the substrate, wherein step a2) further comprises depositing electrically insulating material in the at least one extended trench, thereby forming the at least one extended shallow trench isolation structure. It is a benefit of embodiments of the present disclosure that the shallow trench isolation structures may aid in electrically isolating the source and drain contacts, or the different vias for the source and drain contacts, of different active devices. It is a benefit of embodiments comprising the extended shallow trench isolation structures, that the extended shallow trench isolation structures may aid in separating the regions in the second section of the substrate from each other, and may thus physically and electrically separate the subsequently formed buried power rails, formed in the regions, from each other.

In embodiments, the electrically insulating material for forming the shallow trench isolation structures and, when present, the extended shallow trench isolation structures may be an ILD, such as $SiO_2$. In embodiments, the extended shallow trench isolation structures are formed of a different material than the sacrificial plug. After said deposition of the electrically insulating material, the electrically insulating material may be planarized so that only the trenches and the extended trenches are filled with the electrically insulating material. For example, grinding and/or chemical mechanical polishing may be used for said planarization.

In embodiments, the method further comprises forming the via and the source or drain contact of the first active device in the substrate by: a3) removing part of the substrate material in the first separating portion between adjacent shallow trench isolation structures so as to form a hole defining the via; a4) depositing a sacrificial material in the via so as to form the sacrificial plug; and a5) forming the source or drain contact of the first active device on the sacrificial plug, e.g., on a second end of the sacrificial plug, opposite to the first end of the sacrificial plug.

In embodiments comprising the at least one extended shallow trench isolation structure, step f) comprises: f1) depositing the electrically conductive material so that the deposited electrically conductive material covers the first end of the at least one extended shallow trench isolation structure, wherein the first end faces away from the shallow trench isolation structure from which the extended shallow trench isolation structure extends, i.e., faces towards the backside of the substrate; and f2) performing at least one of grinding, chemical mechanical polishing or an etch back such that a backside of the electrically conductive material (i.e., a surface of the electrically conductive material facing away from the frontside of the substrate) is coplanar with the first end of the extended shallow trench isolation structure. It is a benefit of these embodiments that this may be a straightforward way that may ensure that the extended shallow trench isolation structure electrically isolates the buried power rails from each other.

In embodiments different from embodiments comprising the at least one extended shallow trench isolation structure, the buried power rail may be formed by depositing, on a backside of the substrate, opposite to the frontside of the substrate, a layer formed of a dielectric material, etching a trench in the dielectric material to define the buried power rail, and depositing the electrically conductive material in the trench in the dielectric material. These embodiments may be performed using conventional damascene processes. Depositing the layer formed of the dielectric material and the etching of the trench in the dielectric material may be performed after said depositing of the electrically conductive material in the via in step f), or may be performed before step f). For example, depositing the layer formed of the dielectric material and the etching of the trench in the dielectric material may be performed before removing the sacrificial plug. Depositing the electrically conductive material in the trench in the dielectric material may be performed when providing the electrically conductive material in step f), which may be provided also in the trenches in the dielectric material, of may be a separate step, i.e., first providing the electrically conductive material in the via, and then providing the same or a different electrically conductive material in the trenches in the dielectric material.

In embodiments comprising the at least one extended shallow trench isolation structure, as the separating portions separating the plurality of shallow trench isolation structures from each other may be located over the plurality of regions in the second section of the substrate, the via in the first separating portion may be used for electrical contact between the source or drain contact of the first active device, and the buried power rails. In some embodiments, each separating portion is located completely over one of the plurality of regions. The at least one extended shallow trench isolation structure may aid in good self-alignment between the via and the buried power rail.

At least part of the via is located in said first separating portion between the first pair of adjacent shallow trench isolation structures. Another part of the via may be located in the device layer. Still another part of the via may be located in the second section of the substrate, for example, when the sacrificial plug protrudes in the second section. In some embodiments, the via is completely located in said first separating portion. In the embodiments, the first end of the plug is coplanar with the first end of the shallow trench isolation structures, and the second end of the plug is coplanar with the frontside of the substrate.

In embodiments, each extended shallow trench isolation structure has a first width, in a direction from a first of both largest opposing surfaces to a second of both largest opposing surfaces of the extended shallow trench isolation structure, largest by area, that is smaller, e.g., at least 20% smaller or at least 50% smaller, than a second width, in said direction, of the shallow trench isolation structure from which the extended shallow trench isolation structure extends. Said second width may be that halfway between a first end, facing the backside of the substrate, and a second end, at the frontside of the substrate, of the shallow trench isolation structure. Said first width may be that halfway between a first end, facing the backside of the substrate, and a second end, contacting the shallow trench isolation structure, of the extended shallow trench isolation. In embodiments, the second end of the extended shallow trench isolation structure has a third width, in said direction, that is smaller, e.g., at least 20% smaller, than a fourth width of a first end of the shallow trench isolation structure from which the extended shallow trench isolation structure extends, in said direction.

In embodiments, each extended shallow trench isolation structure extends from the bottom, i.e., first end, of a different shallow trench isolation structure. In some embodiments, one extended shallow trench isolation structure extends from every two to four shallow trench isolation structures, generally from every other shallow trench isolation structure. It is a benefit of these embodiments that the buried power rails may have a large width and, thus, may exhibit small resistive losses.

In embodiments, step f) comprises depositing the electrically conductive material using electrodeposition or chemical vapor deposition.

In embodiments, the device layer comprises a plurality of first active devices, each comprising a source or drain contact. Herein, in step a), for each first active device, a via and a plug may be formed, each contacting a source or drain contact of a first active device of the plurality of first active devices. The different vias for the different first active devices may be located in different separating portions between adjacent shallow trench isolation structures, and/or may be located at different locations between the same separating portion between adjacent shallow trench isolation structures.

In embodiments, the device layer comprises a plurality of second active devices, each comprising a source or drain contact overlapping with, e.g., contacting, the substrate material in a separating portion between adjacent shallow trench isolation structures.

Any features of any embodiment of the first aspect may be independently as correspondingly described for any embodiment of the second aspect of the present disclosure.

In a second aspect, the present disclosure relates to an integrated circuit device. The integrated circuit device comprises a semiconductor device comprising a device layer on a frontside of a substrate, e.g., back contact layer, the device layer comprising a first active device. The semiconductor device further comprises a frontside interconnect layer on a frontside of the device layer, facing away from the substrate. The substrate comprises a plurality of shallow trench isolation structures in a first section of the substrate at the frontside of the substrate, wherein adjacent shallow trench isolation structures are separated from each other by a separating portion. A liner material covers surfaces of the device layer facing the separating portions, i.e., located at and overlapping with the separating portions. A via, comprising an electrically conductive material, electrically couples a source or drain contact of the first active device to a buried power rail, wherein at least part of the via is located in a first separating portion separating adjacent shallow trench isolation structures, and extends through the liner.

In embodiments, the substrate comprises at least one extended shallow trench isolation structure in a second section of the substrate, contiguous to the first section and at a side of the first section facing the backside of the substrate, each extended shallow trench isolation structure extending from a first end of one of the shallow trench isolation structures, the first end facing the backside of the substrate, wherein the at least one extended shallow trench isolation structure separates a plurality of buried power rails from each other.

In embodiments, a longitudinal axis of each extended shallow trench isolation structure is parallel to a longitudinal axis of the shallow trench isolation structure from which the extended shallow trench isolation structure extends. The longitudinal axis may be a longest central axis of the shallow trench isolation structure or the extended shallow trench isolation structure, in a plane parallel to the frontside of the substrate. In embodiments, the shallow trench isolation structures are oriented substantially parallel to each other. In embodiments comprising a plurality of extended shallow trench isolation structures, the extended shallow trench isolation structures are oriented substantially parallel to each other. In embodiments, the shallow trench isolation structures are oriented side by side. In embodiments comprising a plurality of extended shallow trench isolation structures, the extended shallow trench isolation structures are oriented side by side.

In embodiments, a height of the shallow trench isolation structures, in a direction from the frontside to the backside of the substrate, ranges from 5 nm to 200 nm, e.g., ranging from 10 nm to 80 nm. In embodiments, a width of the shallow trench isolation structures, in a direction from a first to a second of the two adjacent shallow trench isolation structures, ranges from 10 nm to 200 nm, e.g., ranging from 20 nm to 100 nm. In embodiments, a width between adjacent shallow trench isolation structures, in a direction from a first to a second of two adjacent shallow trench isolation structures, ranges from 3 nm to 50 nm, e.g., ranging from 5 nm to 25 nm. In embodiments, a width of the via, in a direction from the first to the second of the two adjacent shallow trench isolation structures, is equal to the width between the two adjacent shallow trench isolation structures.

In embodiments, a width of the buried power rails, in a direction from a first to a second of the two adjacent shallow trench isolation structures, is at least 50 nm. It is a benefit of these embodiments that the conductivity of the buried power rails may be large. In embodiments, the buried power rails are formed of a highly doped silicon, or a metal, such as tungsten or copper.

In embodiments, the first active device is a field effect transistor, generally selected from a nanosheet field effect transistor, a complementary field effect transistor and a fin field effect transistor.

The frontside interconnect layer may comprise interconnects for electrically interconnecting the first active device with, e.g., different active devices that may be present in the device layer, or with an input or output contact of the integrated circuit device.

Any features of any embodiment of the second aspect may be independently as correspondingly described for any embodiment of the first aspect of the present disclosure.

Particular aspects of the present disclosure are set out in the accompanying independent and dependent claims. Features from the dependent claims may be combined with features of the independent claims and with features of other dependent claims as appropriate and not merely as explicitly set out in the claims.

The above and other characteristics, features and advantages of the present disclosure will become apparent from the following detailed description, taken in conjunction with the accompanying drawings, which illustrate, by way of example, the principles of the present disclosure. This description is given for the sake of example only, without limiting the scope of the present disclosure. The reference figures quoted below refer to the attached drawings.

BRIEF DESCRIPTION OF THE DRAWINGS

Vertical cross-sections of schematic representations of a device layer on a substrate in subsequent steps in a method in accordance with embodiments of the present disclosure are shown in FIGS. 1 to 4.

FIG. 15 and FIG. 16 are vertical cross-sections of a schematic representations of a semiconductor device on a substrate bonded on a carrier wafer in subsequent steps in a method in accordance with embodiments of the present disclosure.

FIG. 17 is a block diagram indicating the different steps of a method in accordance with embodiments of the present disclosure.

Figure 1:
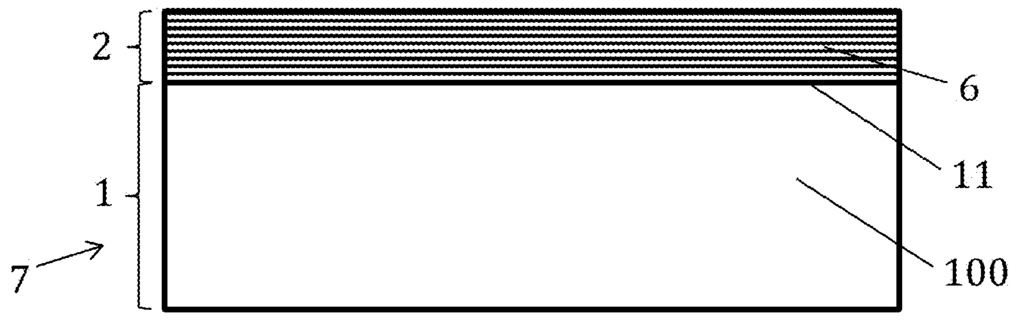
FIG. 1 is a schematic representation of a vertical cross-section of a structure 7 for use in a method for forming an integrated circuit device in accordance with embodiments of the present disclosure.

Throughout the figures, whenever arrows are used to indicate the directions X, Y, and Z, the directions are indicated in the coordination frame of the structure.

In the different figures, the same reference signs refer to the same or analogous elements.

DESCRIPTION OF ILLUSTRATIVE EMBODIMENTS

The present disclosure will be described with respect to particular embodiments and with reference to certain drawings but the present disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the present disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the present disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the present disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. The word "comprising" according to the present disclosure therefore also includes as one embodiment that no further components are present. Thus, the scope of the expression "a device comprising means A and B" should not be interpreted as being limited to devices consisting only of components A and B. It means that with respect to the present disclosure, the only relevant components of the device are A and B.

Similarly, it is to be noticed that the term "coupled", also used in the claims, should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the present disclosure, various features of the present disclosure are sometimes grouped together in a single embodiment, figure, or description thereof for the purpose of streamlining the disclosure and aiding in the understanding of one or more of the various aspects. This method of disclosure, however, is not to be interpreted as reflecting an intention that the claimed disclosure requires more features than are expressly recited in each claim. Rather, as the following claims reflect, aspects lie in less than all features of a single foregoing disclosed embodiment. Thus, the claims following the detailed description are hereby expressly incorporated into this detailed description, with each claim standing on its own as a separate embodiment of this present disclosure.

Furthermore, while some embodiments described herein include some but not other features included in other embodiments, combinations of features of different embodiments are meant to be within the scope of the present disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the present disclosure.

In the description provided herein, numerous specific details are set forth. However, it is understood that embodiments of the present disclosure may be practiced without these specific details. In other instances, well-known methods, structures and techniques have not been shown in detail in order not to obscure an understanding of this description.

The following terms are provided solely to aid in the understanding of the present disclosure.

Reference will be made to transistors. These are three-terminal devices having a first main electrode such as a drain, a second main electrode such as a source and a control electrode such as a gate for controlling the flow of electrical charges between the first and second main electrodes.

Within the context of the present disclosure, when it is said that two shallow trench isolation structures are adjacent to each other, this may be understood to mean that no extended shallow trench isolation structure is located between the adjacent shallow trench isolation structures, at least at the location where the part of the via is located between the adjacent shallow trench isolation structures, usually at any location along the shallow trench isolation structures. For example, when it is said that a first shallow trench isolation structure and a second shallow trench isolation structure are adjacent to each other, another shallow trench isolation structure, e.g., a third shallow trench isolation structure, may not be located between the first shallow trench isolation structure and the second shallow trench isolation structure, at least at the location where the part of the via, if present, is located between the first and extended shallow trench isolation structures, but usually at any location along the shallow trench isolation structures.

The terms "frontside" and "backside" of a substrate refer respectively to the two mutually opposite (main) sides of the substrate, wherein the frontside is the side of the substrate on which the active device, e.g., the transistor (and any further active devices), is formed and the backside is the opposite side of the substrate. The terms "frontside" and "backside" may also be used with reference to the integrated circuit device, with a corresponding meaning.

The term "source or drain" as used herein is to be understood as a source or a drain. Hence, "source or drain contact" may either be a source contact or a drain contact.

The present disclosure will now be described by a detailed description of several embodiments of the present disclosure. It is clear that other embodiments of the present disclosure can be configured without departing from the technical teaching of the present disclosure, the present disclosure being limited only by the terms of the appended claims.

In what follows, an example of a method for forming an integrated circuit device in accordance with embodiments of the present disclosure is described. In this example, the active devices, e.g., the first and second active devices, of the device layer are nanosheet field effect transistors, but the present disclosure is not limited thereto. For example, alternatively, the active devices could be finFETs. Although a particular process flow is described, this is an example and the present disclosure is not limited thereto.

In what follows, reference is simultaneously made to FIG. 17, which is a block diagram of a process flow in accordance with embodiments of the present disclosure. First, a step a) of forming 901 a semiconductor device on a frontside of a substrate is described.

Reference is made to FIG. 1, which is a schematic representation of a vertical cross-section of a structure 7 for use in a method for forming an integrated circuit device in accordance with embodiments of the present disclosure. In this example, first, the formation of a semiconductor device on a frontside 11 of a substrate 1 is described. In this example, a device layer 2 comprising a stack of layers 6 is obtained on a frontside 11 of the substrate 1. The substrate is formed of a substrate material 100, which is in this example a semiconductor substrate material. The stack of layers 6 is for forming nanosheet channels for active devices which are, in this example, nanosheet field effect transistors. However, alternatively, the active devices could, for example, be fin field effect transistors (finFETs), for which a different formation route may be used, including, for example, the formation of a bottom dielectric isolation or a silicon germanium layer for stopping the etch, or a timed etch, when removing the substrate material after finishing the frontside formation of the semiconductor device. In this example, the stack of layers 6 comprises layers of silicon alternating with layers of silicon-germanium. The layers of silicon may, after further processing (e.g., n-doping or p-doping), form the nanosheet channels, and the layers of silicon-germanium may be sacrificial layers that may, at a later stage, be removed and be replaced by a gate stack.

The substrate 1 may be a conventional semiconductor substrate suitable for CMOS processing. The substrate 1 may be a single-layered semiconductor substrate, for instance formed by a bulk substrate such as a Si substrate, a germanium (Ge) substrate or a silicon-germanium (SiGe) substrate. A multi-layered/composite substrate is however also possible, such as an epitaxially grown semiconductor layer on a bulk substrate, or a semiconductor-on-insulator (SOI) substrate, such as a Si-on-insulator substrate, a Ge-on-insulator substrate, or a SiGe-on-insulator substrate. In this example, the substrate 1 is a semiconductor substrate 1.

Figure 2:
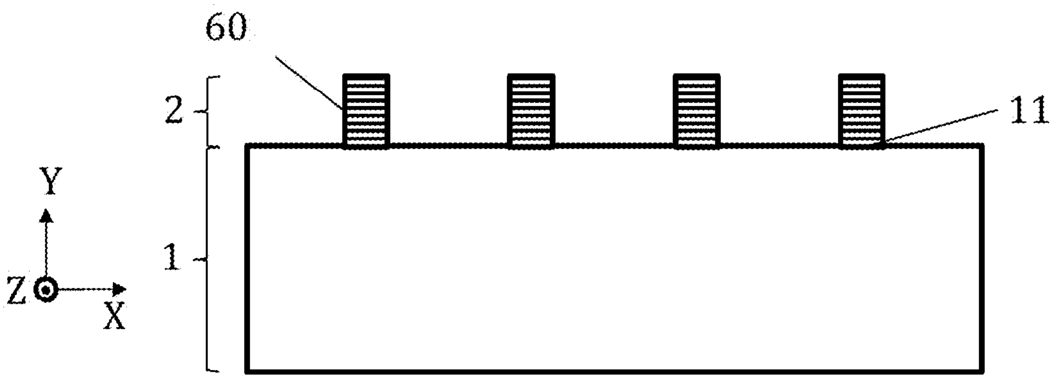
FIG. 2 shows that a patterned mask (not shown) may be applied on top of the device layer 2 and the pattern of the mask may be transferred, by etching, into the device layer 2, thereby forming a fin structure or a patterned stack of layers, comprising a plurality of device structures 60 in the device layer 2.

Reference is made to FIG. 2. A patterned mask (not shown) may be applied on top of the device layer 2 and the pattern of the mask may be transferred, by etching, into the device layer 2, thereby forming a fin structure or a patterned stack of layers, comprising a plurality of device structures 60 in the device layer 2.

The device structures 60 may comprise a plurality of line structures formed from the stack of layers 6 on the frontside 11 of the semiconductor substrate 1. Each line structure may form an elongated fin-shaped structure with a longitudinal dimension oriented in the Z-direction and protruding in the Y-direction from the substrate 1. Each device structure 60 has a width dimension oriented in the X-direction, wherein the width may be from 3 nm to 50 nm, e.g., from 5 nm to 25 nm. In this example, the device structures 60 extend in parallel to each other and are spaced apart in the X-direction. While reference in the following will mainly be made to a device structure 60, the method to be disclosed may be applied in parallel to any number of fin structures. The fin structures may be formed, e.g., by etching trenches in the semiconductor device layer of a channel material (e.g., for forming a finFET device), or in a semiconductor layer stack of sacrificial layers of a sacrificial material and channel layers of a channel material, arranged alternatingly with each other (e.g., for forming a nanowire- or nanosheet-channel FET devices).

Figure 3:
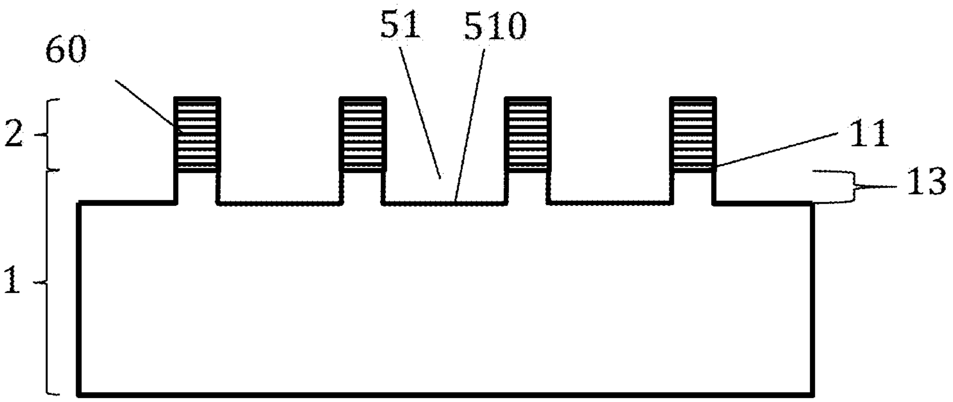
FIG. 3 shows after forming the device structures 60, a plurality of shallow trench isolation (STI) structures and extended shallow trench isolation structures are formed.

Reference is made to FIG. 3. After forming the device structures 60, a plurality of shallow trench isolation (STI) structures and extended shallow trench isolation structures are formed. This is done by providing a plurality of trenches 51. The plurality of trenches 51 are formed in a first section 13 of the substrate 1, at the frontside 11 of the substrate, by etching through the frontside 11 of the substrate 1. The bottom 510 of the trenches 51 may define a first end of the first section 13 of the substrate 1, and a second end of the first section 13 is the frontside 11 of the substrate 1.

Figure 4:
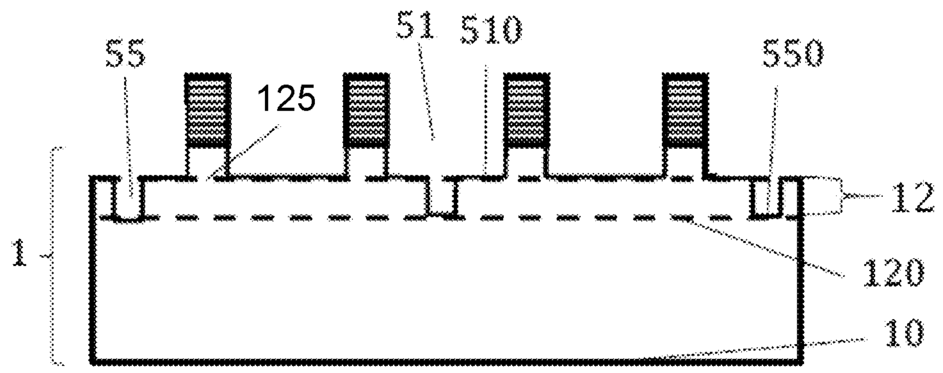
FIG. 4 shows extended trenches 55 are formed in a second section 12 of the substrate 1, contiguous to the first section 13 and at a side of the first section 13 facing the backside 10 of the substrate 1, through the bottom 510 of the trenches 51.

Reference is made to FIG. 4. Extended trenches 55 are formed in a second section 12 of the substrate 1, contiguous to the first section 13 and at a side of the first section 13 facing the backside 10 of the substrate 1, through the bottom 510 of the trenches 51. A first, bottom, end 550 of the extended trenches 55 may define a first end (indicated by the dashed line 120) of the second section 12 of the substrate 1. In this example, one extended trench 55 is formed through every other trench 51. The first end (indicated by the dashed line) of the first section 13 is at the same location as a second end 125 of the second section 12. The second end 125 of the second section 12 is opposite to the first end 120 of the second section 12.

In a next step, these trenches 51 and extended trenches 55 are filled with an electrically insulating material (e.g. an ILD such as $SiO_2$), thereby forming respectively shallow trench isolation (STI) structures and extended shallow trench isolation structures. The insulating material may be etched back to a desired height. Techniques for device patterning and STI formation are per se well known in the art and will hence not be further discussed herein.

Figure 5A:
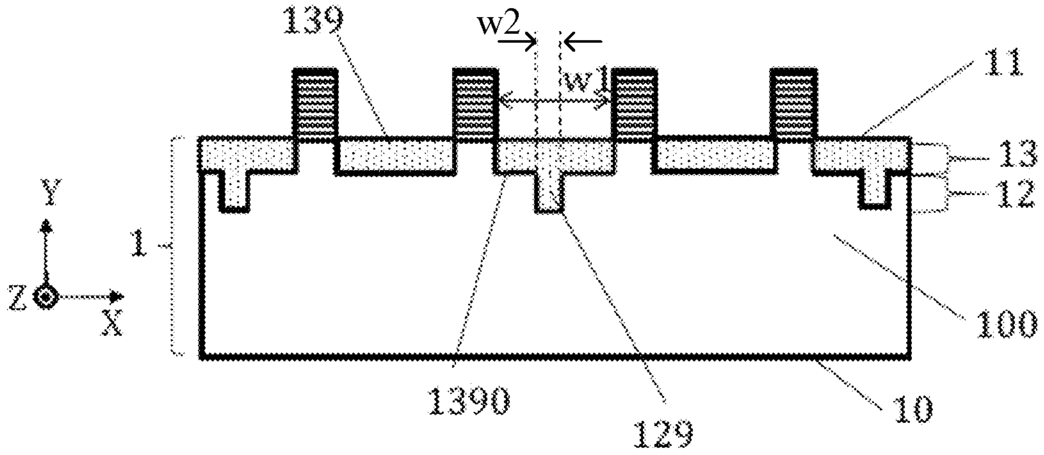
FIG. 5A and FIG. 5B are a vertical cross-section and a top view, respectively, of a schematic representation of a device layer on a substrate in a method in accordance with embodiments of the present disclosure.
Figure 5B:
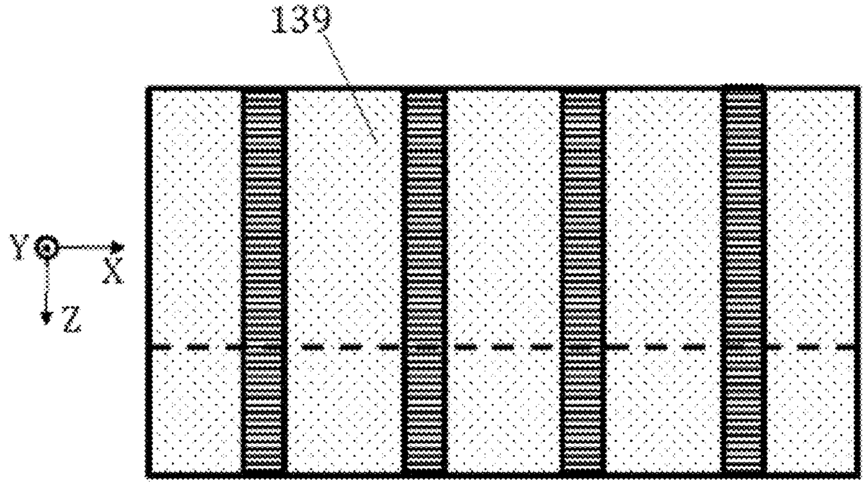

Reference is, simultaneously, made to FIG. 5A and FIG. 5B, wherein FIG. 5A is a vertical cross-section along the dashed line shown in the top view of FIG. 5B. After deposition of the electrically insulating material, the extended shallow trench isolation structures 129 are formed in the second section 12 of the substrate 1, and the shallow trench isolation structures 139 are formed in the first section 13 of the substrate 1, embedded in the substrate material 100. Herein, each extended shallow trench isolation structure 129 extends from a first end or surface 1390, facing the backside 10 of the substrate 1, of one of the shallow trench isolation structures 139. In this example, one extended shallow trench isolation structure 129 extends from every two shallow trench isolation structures 139. In this example, a longitudinal axis of each of the shallow trench isolation structures 139 is parallel with respect to a longitudinal axis of each of the extended shallow trench isolation structures 129. That is, in this example, each of the longitudinal axes is oriented along the Z direction, and in a plane of the frontside 11 of the substrate that is in the X-Z plane. A width w2 of the extended shallow trench isolation structure 129 is, in this example, smaller than a width w1 of the shallow trench isolation structure 139 from which the extended shallow trench isolation structure 129 extends. Herein, the width is in a direction from a first to a second of two adjacent shallow trench isolation structures 139, i.e., in the direction of X.

Figure 6A:
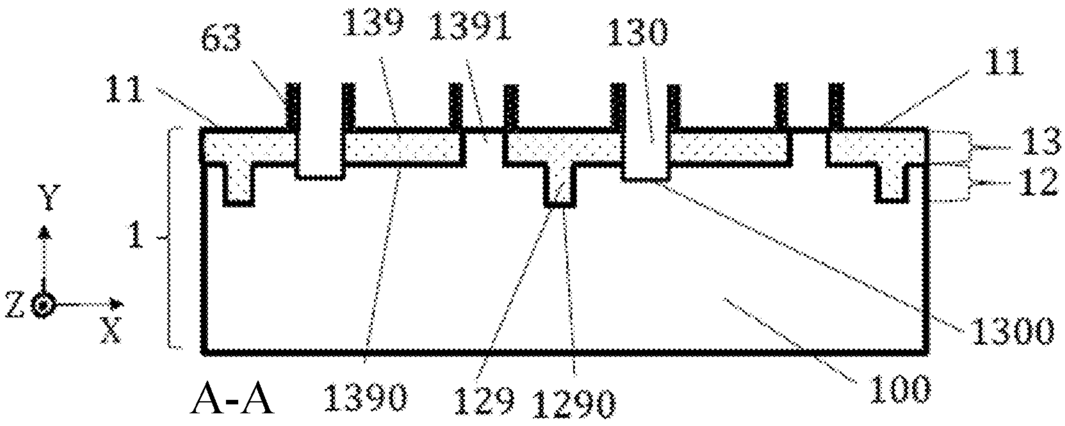
FIG. 6A, FIG. 6B and FIG. 6C are a first vertical cross-section, a second vertical cross-section and a top view, respectively, of a schematic representation of a device layer on a substrate in a method in accordance with embodiments of the present disclosure.
Figure 6B:
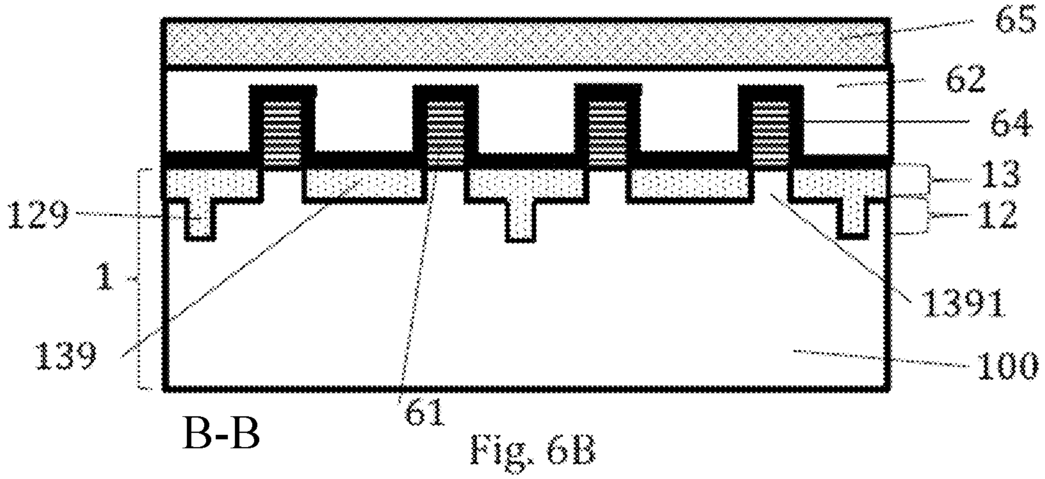
Figure 6C:
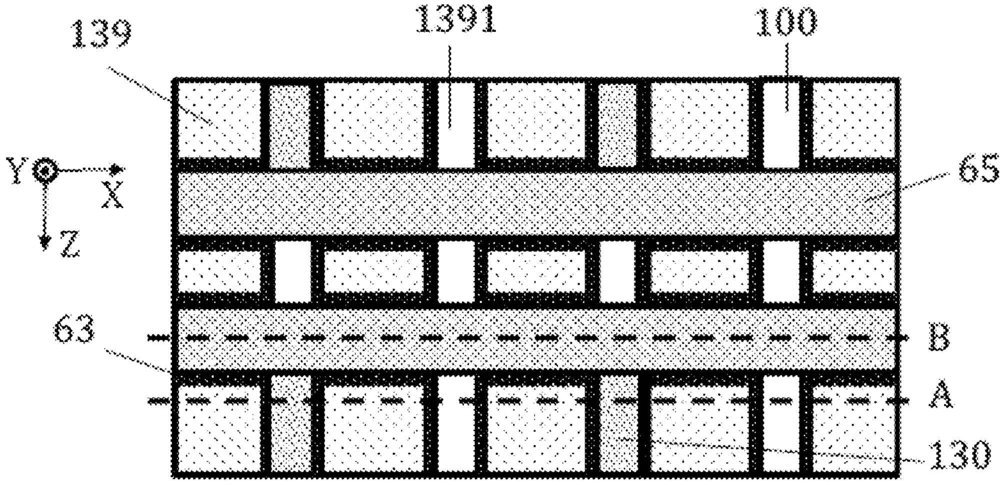

Reference is, simultaneously, made to FIG. 6A, FIG. 6B, and FIG. 6C, wherein FIG. 6A is a vertical cross-section along the dashed line A shown in the top view of FIG. 6C, and wherein FIG. 6B is a vertical cross-section along the dashed line B shown in the top view of FIG. 6C. After formation of the shallow trench isolation structures 139 and the extended shallow trench isolation structures 129, several processing steps may be performed, including deposition of a dummy gate oxide 64, formation of a dummy gate 62, etching of the device structures into separate nanosheet channels 61 and to provide spaces for forming source or drain contacts, using a hard mask 65, and formation of a gate spacer 63. These processing steps are well known in the art and are not described in further detail here.

In this example, part of the substrate material 100, at particular locations in some of the separating portions 1391 between some adjacent shallow trench isolation structures 139, is removed so as to form a hole defining a via 130. At the same time, in this example, the substrate material 100 is not removed at different locations the separating portions 1391, which is achieved using a mask (not shown). In this example, the hole defining the via 130 extends through the first section 13, and into the second section 12, of the substrate 1. As such, a bottom surface 1300 of the hole defining the via 130 is located in the second section 12.

In other words, in this example, a distance between a bottom surface 1300 of the hole defining the via 130, and the frontside 11 of the substrate 1 is larger than a distance between the first end 1390 of each of the shallow trench isolation structures 139 separated by the separating portion 1391 in which the hole defining the via 130 is formed, and the frontside 11 of the substrate 1. Furthermore, in this example, a distance between the bottom surface 1300 of the hole defining the via 130 and the top surface 11 of the substrate 1 is smaller than a distance between a first end 1290 of the (e.g., nearest to the hole defining the via) extended shallow trench isolation structure 129 and the top surface 11 of the substrate 1.

Figure 7A:
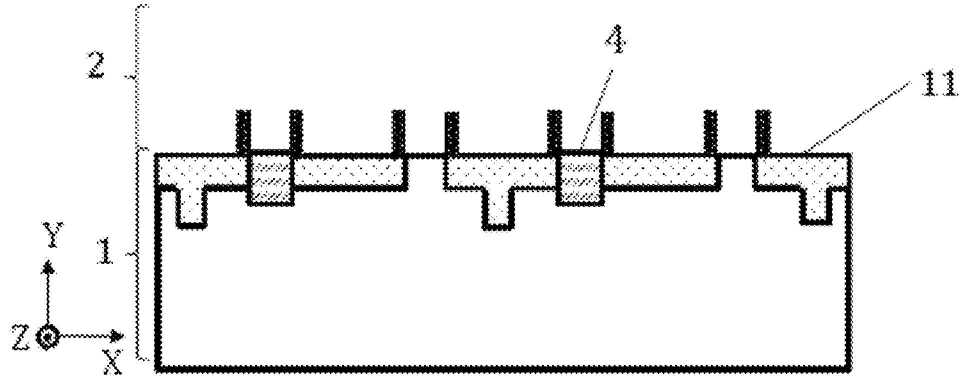
FIG. 7A and FIG. 7B are a vertical cross-section and a top view, respectively, of a schematic representation of a device layer on a substrate in a method in accordance with embodiments of the present disclosure.
Figure 7B:
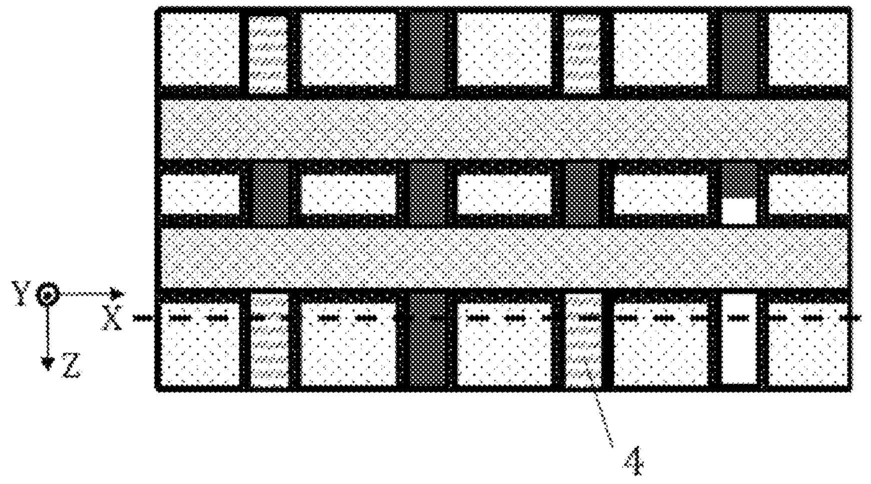

Reference is, simultaneously, made to FIG. 7A and FIG. 7B, wherein FIG. 7A is a vertical cross-section along the dashed line shown in the top view of FIG. 7B. A sacrificial material is deposited covering the frontside 11 of the substrate 1 and the device layer 2, and deposited in the holes defining the vias. Subsequently, a partial planarization and an etch back may be performed, so that only the sacrificial material in the holes defining the vias is retained, thereby forming, from the sacrificial material, the sacrificial plugs 4.

Figure 8A:
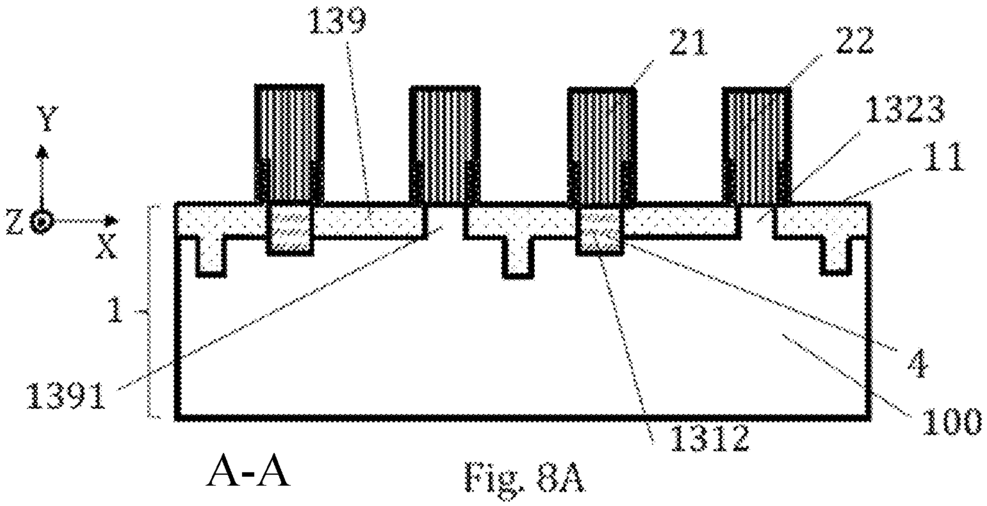
FIG. 8A, FIG. 8B, FIG. 8C, and FIG. 8D are a first vertical cross-section, a second vertical cross-section, a first top view, and a second top view omitting some of the features, respectively, of a schematic representation of a device layer on a substrate in a method in accordance with embodiments of the present disclosure.
Figure 8B:
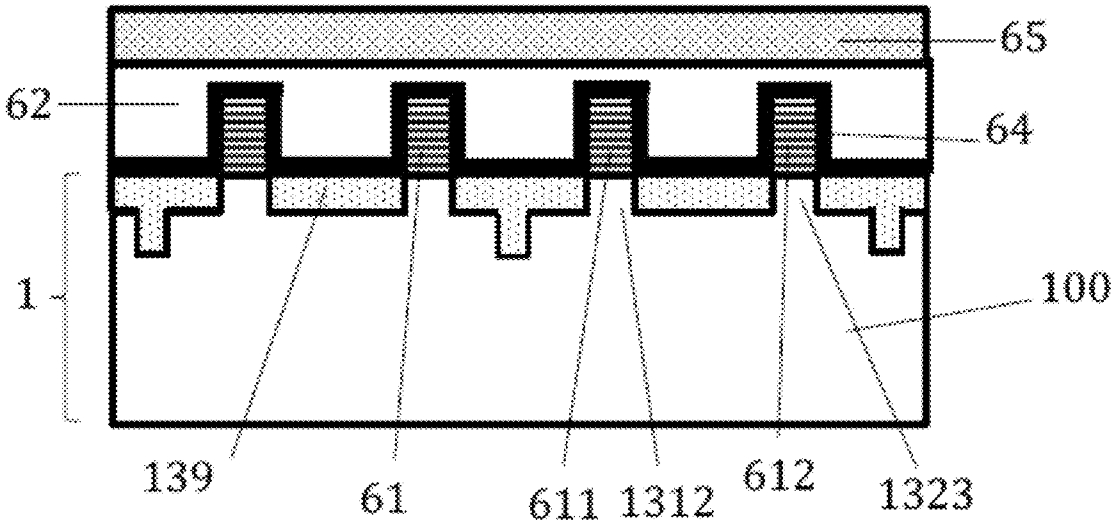
Figure 8C:
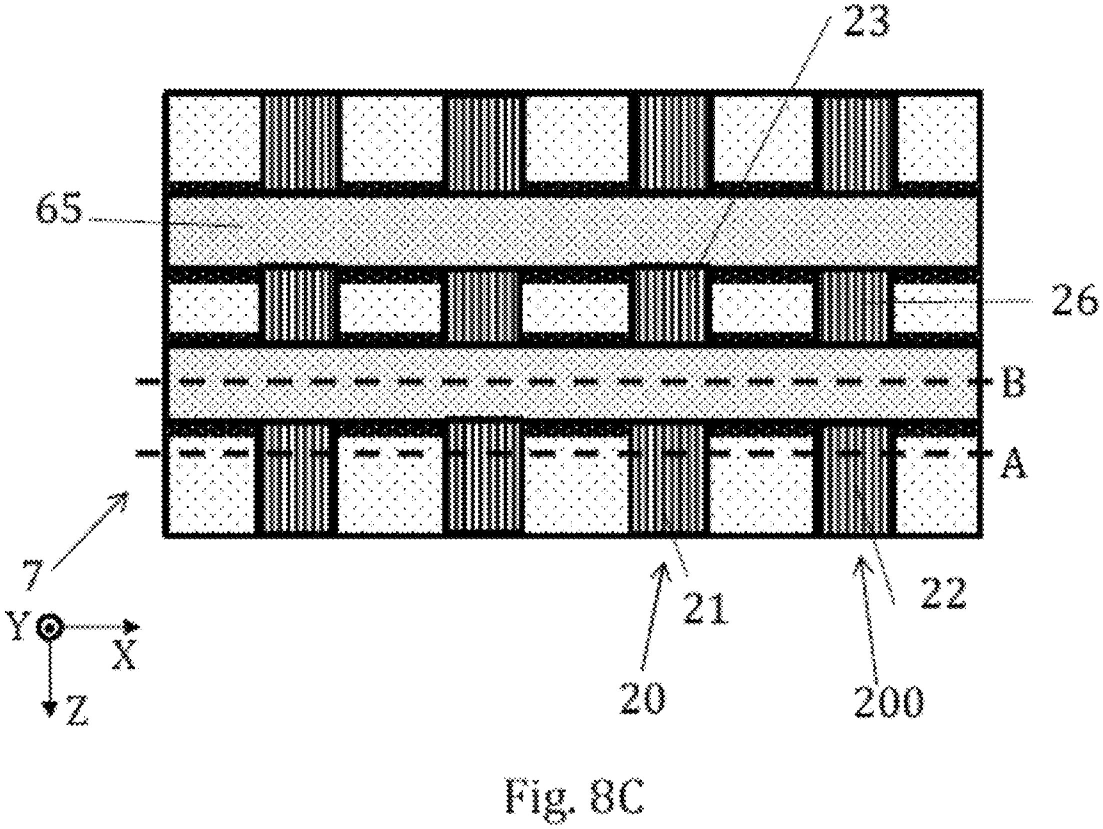
Figure 8D:
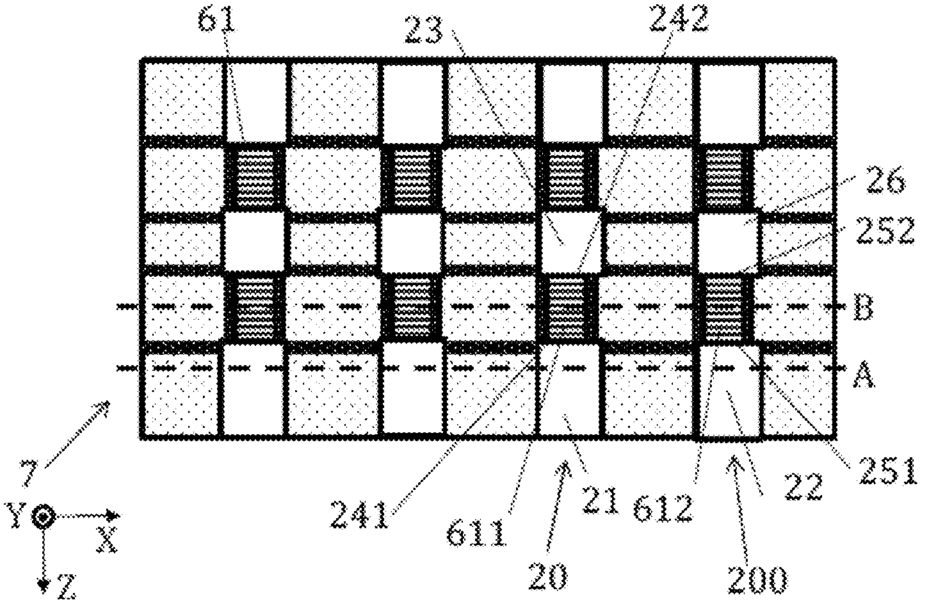

Reference is, simultaneously, made to FIG. 8A, FIG. 8B, FIG. 8C and FIG. 8D, wherein FIG. 8A is a vertical cross-section along the dashed line A shown in the top view of FIG. 8C, and wherein FIG. 8B is a vertical cross-section along the dashed line B shown in the top view of FIG. 8C. FIG. 8D corresponds to FIG. 8C, but in FIG. 8D, for clarity, the dummy gate oxide 64, the dummy gate 62, and the hard mask 65, have been omitted, so that the nanosheet channels 61, covered by the dummy gate oxide 64, the dummy gate 62, and the hard mask 65, may be observed in FIG. 8D. Furthermore, the hatching used for all source or drain regions 21, 22, 23, 26 in the other figures, is removed in FIG. 8D, for clarity.

Source or drain contacts 21 are epitaxially grown on each sacrificial plug 4 and source and drain contacts 22 are also epitaxially grown on exposed substrate material 100 at the frontside 11 in the separating portions 1391 between adjacent shallow trench isolation structures 139, of the substrate 1. In this example, each source and drain contact 21 on a sacrificial plug 4 and each source and drain contact 22 on the substrate material 100 further contacts two nanosheet channels 61, as is typically the case for nanosheet field effect transistors that are formed in this example.

In this example, an exemplary first active device 20 may comprise: a source or drain contact 21 on a sacrificial plug 4 in a first separating portion 1312 between adjacent shallow trench isolation structures 139; a first nanosheet channel 611, contacting, at a first side 241, the source or drain contact 21 on the plug 4; and a further source or drain contact 23 on the substrate material 100, contacting a second side 242, opposite to the first side 241, of the first nanosheet channel 611.

In this example, an exemplary second active device 200 may comprise: a source or drain contact 22 formed on the substrate material 100 in a second separating portion 1323 between adjacent shallow trench isolation structures 139; a second nanosheet channel 612, contacting, at a first side 251, the source or drain contact 22 on the substrate material 100; and a further source or drain contact 26 on the substrate material 100, contacting a second side 252, opposite to the first side 251, of the second nanosheet channel 612.

Figure 9:
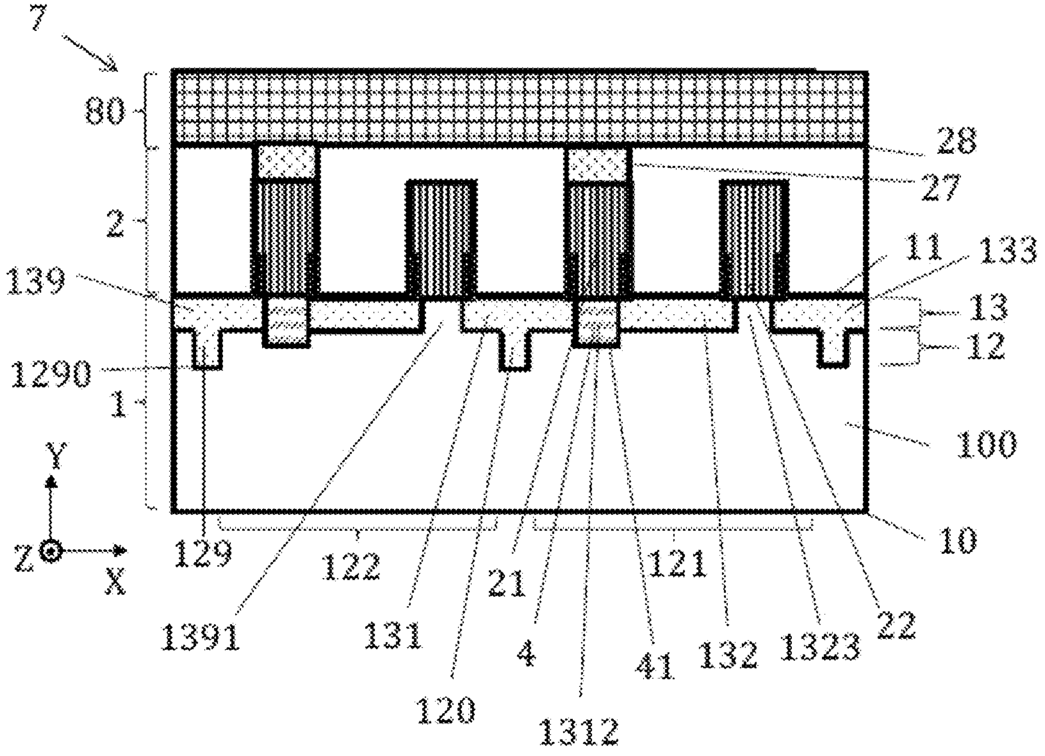
FIG. 9 is a vertical cross-sections of schematic representations of a semiconductor device on a substrate in a method in accordance with embodiments of the present disclosure.

After further processing steps that are well-known in the art and will, thus, not be further explained here, such as dummy gate removal and formation of a replacement gate, and providing frontside interconnect structures, the structure 7 of FIG. 9 is obtained. As an example, these further processing steps may comprise replacement gate processing (i.e. forming the gate oxide, the gate contact) and any frontside interconnect structures for the active devices, and filling empty spaces of the device layer 2 with a dielectric material so as to form the device layer 2. Metal contacts 27 (also called MOA or CT) are provided to contact the source or drain contacts 21 with a frontside interconnect layer 80. The frontside interconnect layer 80 may be formed on a frontside 28 of the device layer 2 for interconnecting active devices in the device layer 2. The frontside interconnect layer may be formed employing conventional back-end-of-line (BEOL) techniques, such as damascene processing.

At this stage, the structure 7 comprises a semiconductor device comprising a device layer 2 and the frontside interconnect layer 80 formed during frontside processing on the frontside 11 of a substrate 1. Herein, the device layer 2 comprises a plurality of active devices, including the first active device having the source or drain contact 21 on the sacrificial plug 4, and the second active device having the source or drain contact 22 on the substrate material 100 in the second separating portion 1323 between the second 132 and third shallow trench isolation structures 133. Herein, at least part of the via, filled with the sacrificial plug 4, extends through the first separating portion 1312 between the first 131 and second shallow trench isolation structures 132. The substrate 1 comprises a plurality of shallow trench isolation structures 139 embedded in the substrate material 100, in the first section 13 of the substrate 1, wherein adjacent shallow trench isolation structures 139 are separated from each other by a separating portion 1391. A first pair of adjacent shallow trench isolation structures, comprising a first shallow trench isolation structure 131 and a second shallow trench isolation structure 132, are adjacent to and separated from each other by the first separating portion 1312. The substrate 1 further comprises the extended shallow trench isolation structures 129, embedded in the substrate material 100 in the second section 12 of the substrate 1. The plurality of extended shallow trench isolation structures 129 separate the second section 12 in a plurality of regions. As one example, a first extended shallow trench isolation structure 120 separates a first region 121 from a second region 122 in the second section 12. In this example, the first separating portion 1312 through which a sacrificial via 4 extends, between the first shallow trench isolation structure 131 and the second shallow trench isolation structure 132, is located over the first region 121. In this example, also the second separating portion 1323 is, in this example, located over the first region 121, but is not limited thereto and could instead be located over the second region 122 or still another region.

In this example, a distance between the frontside 11 of the substrate 1 and the first end 41 of the sacrificial plug 4, facing towards a backside 10 of the substrate 1, is smaller than a distance between the top surface 11 of the substrate 1 and a first end 1290 of the extended shallow trench isolation structure 129. Furthermore, the sacrificial plug 4 located between the first shallow trench isolation structure 131 and the second shallow trench isolation structure 132 protrudes farther into the substrate than the first shallow trench isolation structure 131 and the second shallow trench isolation structure 132, and into the first region 121 of the second section 12 of the substrate 1. As such, the first end 41 of the sacrificial plug 4 is located in first region 121 of the second section 12 of the substrate 1.

In this example, the formation of the frontside interconnect layer 80 terminates the processing from the frontside 11 of the substrate 1, wherein the semiconductor device, comprising the device layer 2 and the frontside interconnect layer 80, is formed 901 (see FIG. 17) on the frontside 11 of the substrate 1. In this example, the processing is continued from the backside 10, which involves flipping of the front-processed structure 7 and bonding the structure 7, i.e., the frontside interconnect layer 80, to a carrier wafer for providing mechanical support. Any suitable industry standard bonding technique may be used for this purpose. The flipping may, for example, be performed using a dedicated wafer flipping module, or may be performed manually.

Figure 10:
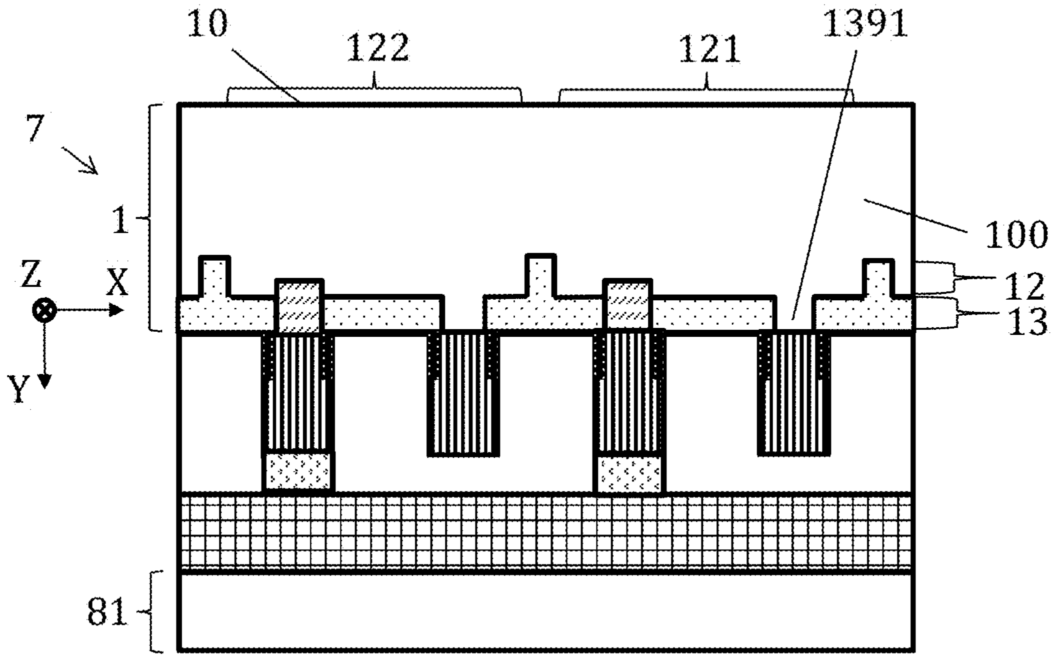
FIG. 10 is a vertical cross-sections of schematic representations of a semiconductor device on a substrate in a method in accordance with embodiments of the present disclosure, after flipping and bonding to a carrier wafer.

Reference is made to FIG. 10, which is the structure 7 after said flipping and said bonding to the carrier wafer 81. The arrows indicating the directions X, Y, and Z are in the coordination frame of the structure 7, and coordination frame flips together with the structure 7. The substrate 1 is subsequently thinned from the backside 10. In this example, the substrate material 100 is removed 902 (see FIG. 17) from the backside 10, first by wafer thinning, then by using chemical mechanical polishing, and then by performing a straight etch. This removes the substrate material 100 from the substrate 1, including from the regions of the second section 12, such as the first 121 and second region 122, and from the first section 13, including any substrate material 100 in the separating portions 1391.

Figure 11A:
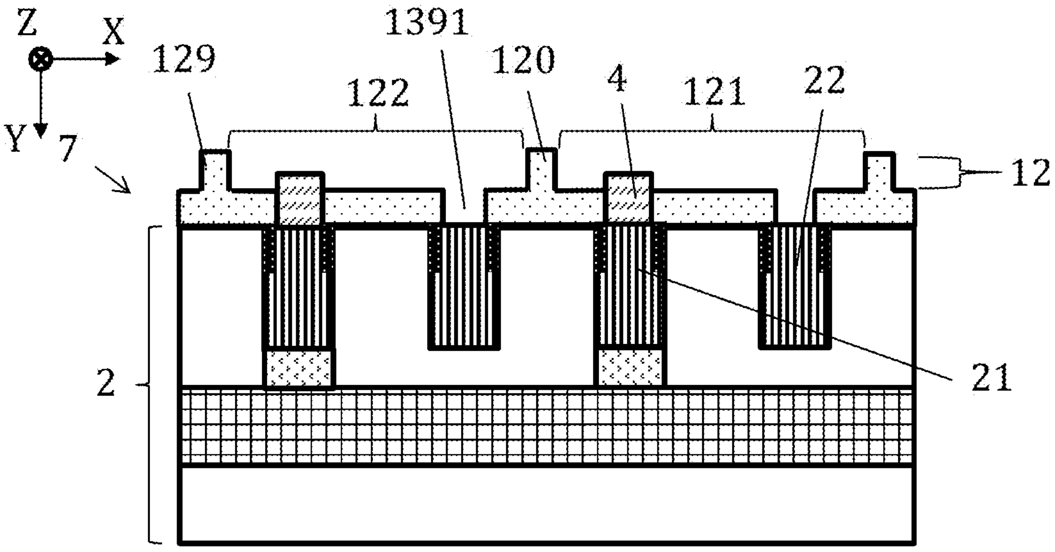
FIG. 11A and FIG. 11B are a vertical cross-section and a top view, respectively, of a schematic representation of a semiconductor device on a substrate bonded on a carrier wafer in a method in accordance with embodiments of the present disclosure.
Figure 11B:
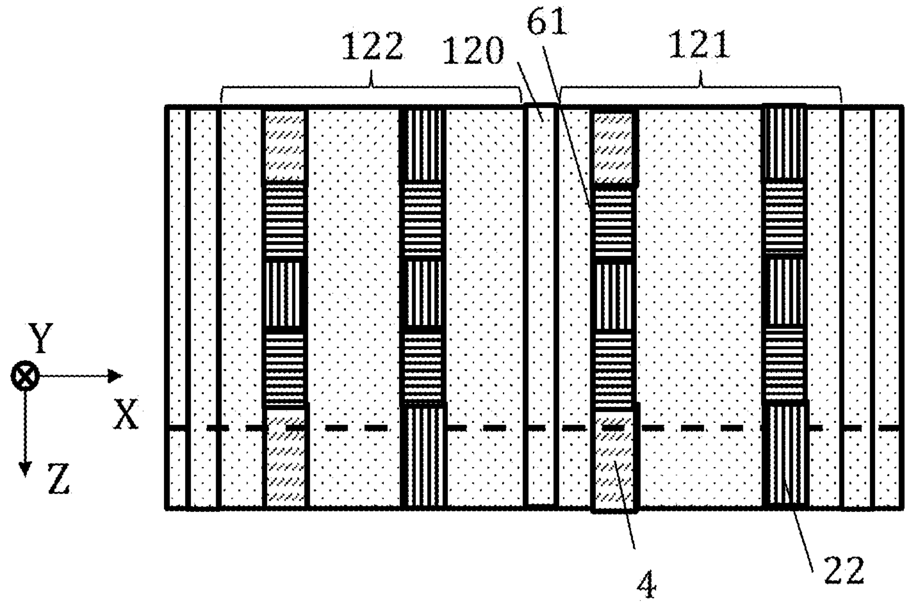

This removal 902 (see FIG. 17) of the substrate material 100 results, in this example, in the structure 7 of FIG. 11A and FIG. 11B, wherein FIG. 11A is a vertical cross-section along the dashed line shown in the bottom view of FIG. 11B. Herein, FIG. 11B is shown mirrored with respect to the X-Y plane (see the arrows indicating the respective directions). As a result of said removal, the regions in the second section 12, including the first 121 and second region 122 separated by the first extended shallow trench isolation structure 120, form, in this example, gaps between the extended shallow trench isolation structures 129. As a result of said removal, the sacrificial plugs 4 are exposed. As the substrate material is removed from the separating portions 1391, surfaces of the device layer 2 (that is, the surfaces not overlapping with the plugs 4) facing the separating portions 1391 are exposed. Thereby, for example, the source or drain contact 22 of the exemplary second active device is, as a result of said removal, exposed. Furthermore, in this example, the nanosheet channels 61 are exposed. However, in another example, an isolation layer, e.g., bottom dielectric isolation, could be present below channel structures, e.g., nanosheet channels 61, of the different active devices, in which case the nanosheet channels 61 would not be exposed, but, instead, said isolation layer may be exposed.

Figure 12:
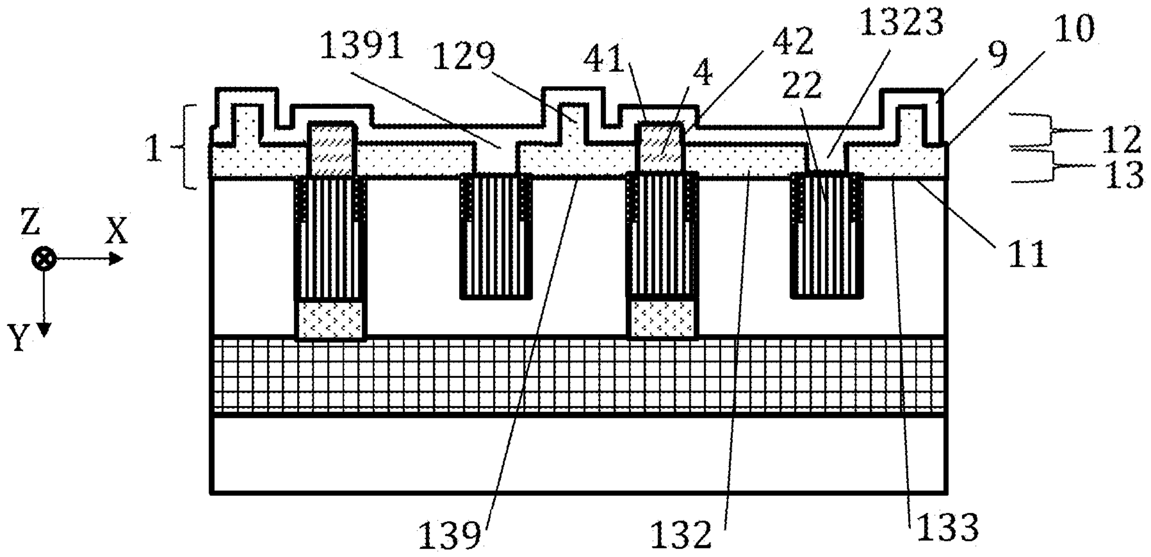
FIGS. 12 and 13 are a vertical cross-section of a schematic representation of a semiconductor device on a substrate bonded on a carrier wafer in subsequent steps in a method in accordance with embodiments of the present disclosure.

Reference is made to FIG. 12. A liner 9 is deposited 903 (see FIG. 17) conformally covering a backside 10, opposite to the frontside 11, of the substrate 1, covering the first end 41, and part of the sides 42 different from the first end 41 (that is, sides 42 that were exposed before said deposition of the liner 9) of the sacrificial plugs 4, surfaces of the separating portions 1391 including the source or drain contact 22 of the second active device and the nanosheet channels of the active devices. Also surfaces of the extended shallow trench isolation structures 129 and surfaces of the shallow trench isolation structures 139 are covered by the liner 9. The liner 9 comprises a dielectric material, such as $SiO_2$ or SiN, and may be deposited using atomic layer deposition. Herein, the deposited liner 9 has a thickness, which may be a mean thickness, e.g., at the first end 41 of the sacrificial plug 4, that is larger than half of a distance, e.g., mean distance, separating adjacent shallow trench isolation structures 139, that is, in the direction of X. Herein, the thickness is in a direction perpendicular to the frontside 11 of the substrate 1 or the first end 41 of the plug 4, i.e., in the direction of Y. For example, the deposited liner 9 has a thickness, e.g., at the first end 41 of the plug 4, that is larger than half of a width of a second separating portion 1323 between the second shallow trench isolation structure 132 and a third shallow trench isolation structure 133, that is, in the direction of X. Thereby, the liner 9 is deposited 903 (see FIG. 17) completely filling the separating portions 1391, e.g., the second separating portion 1323, and said separating portions 1391 may, after said filling, be overfilled with the liner 9. In this example, the thickness of the deposited liner 9 is smaller than the thickness of the first section 13, in a direction perpendicular to the frontside 11 of the substrate 1, i.e., in the direction of Y.

As a result, the source or drain contact 22 of the second active device may be covered by material of the deposited liner 9 having a thickness that is larger than the thickness of the liner at the first end 41 of the sacrificial plug 4.

Figure 13:
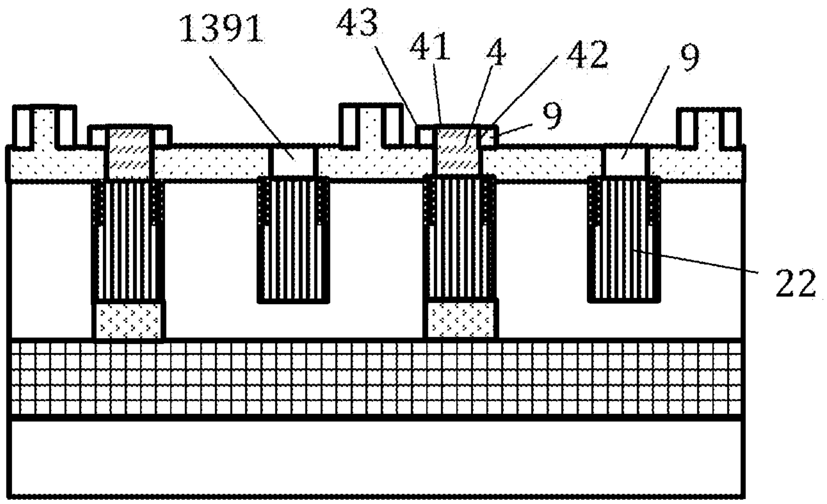

Reference is made to FIG. 13. As a result, when the liner 9 is anisotropically etched 904 (see FIG. 17), which may be performed using any known technique, the liner 9 may be completely removed from the first end 41 of the plug 4, while still at least partially filling, usually completely filling, the separating portions 1391, thereby covering the source or drain contact 22 of the second active device, and the nanosheet channels.

Furthermore, as an anisotropic etch is used 904 (see FIG. 17), the liner 9 covering sides 42 of the plug 4 different from the first end 41 that were exposed before depositing the liner 9, may remain covered by the liner 9 when the liner 9 has been removed from the first end 41 of the sacrificial plug 4.

The liner 9 covering the sides 42 of the sacrificial plug 4 different from the first end 41 may form at least part of a template 43 around the sacrificial plug 4. As a result of the anisotropic etch, the template 43 has an opening at, and exposing, the first end 41 of the sacrificial plug 4.

Subsequently, the sacrificial plug 4, i.e., the sacrificial material forming the sacrificial plug 4, may be removed 905 (see FIG. 17) selectively, i.e., etched, with respect to the liner 9.

Figure 14A:
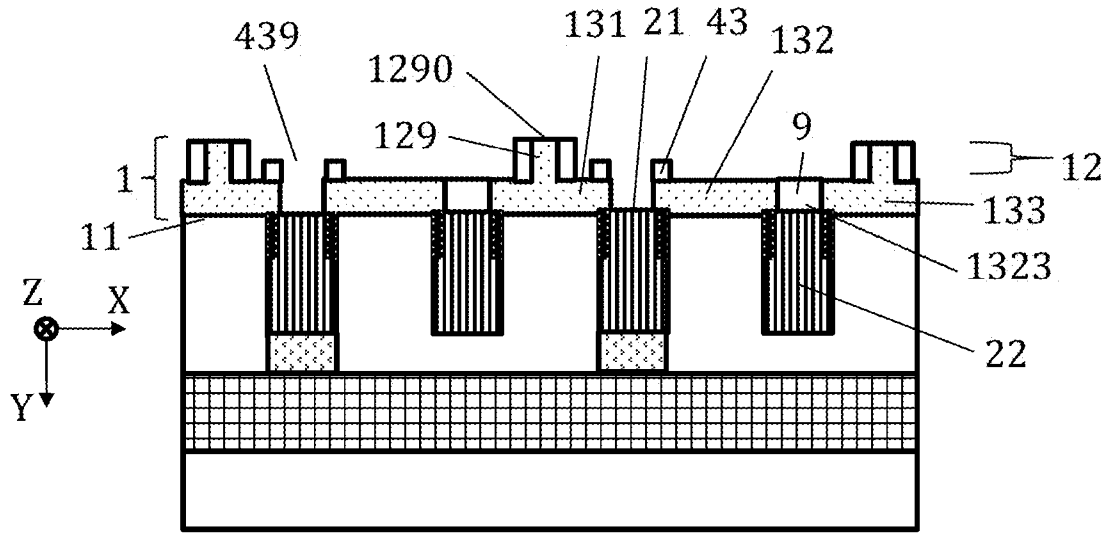
FIG. 14A and FIG. 14B are a vertical cross-section and a bottom view, respectively, of a schematic representation a semiconductor device on a substrate bonded on a carrier wafer in a method in accordance with embodiments of the present disclosure.
Figure 14B:
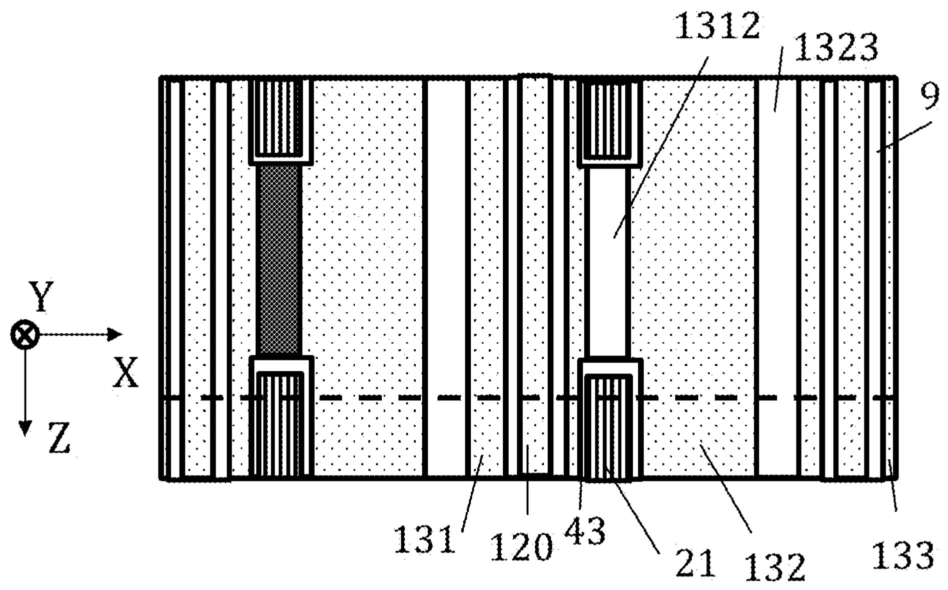

Reference is, simultaneously, made to FIG. 14A and FIG. 14B, wherein FIG. 14A is a vertical cross-section along the dashed line shown in the bottom view of FIG. 14B. Herein, FIG. 14B is shown mirrored with respect to the X-Y plane (see the arrows indicating the respective directions). After removing 905 (see FIG. 17) the sacrificial plugs but not the liner 9, the source or drain contact 21 of the first active device is exposed, while the source or drain contact 22 of the second active device remains covered by the liner 9. The template 43 defining the via is not removed by the etching. As the first end of the plug was located closer to the top surface 11 of the substrate 1 than the first end 1290 of the extended shallow trench isolation structures 129, i.e., was located in the second section 12, the opening 439 of the template 43 is located in the second section 12.

The liner 9 deposited in a first separating portion 1312 between the first shallow trench isolation structure 131 and the second shallow trench isolation structure 132, that is, at locations in the first separating portion 1312 different from the location of the plug before its removal, and in the second separating portion 1323 between the second shallow trench isolation structure 132 and the third shallow trench isolation structure 133, remain filled with the liner 9. This may prevent any electrical losses from the source drain contact 22 of the second active device, and a parasitic channel at the bottom of the nanosheet channels, exposed to the separating portions, of each of the active devices.

Figure 15:
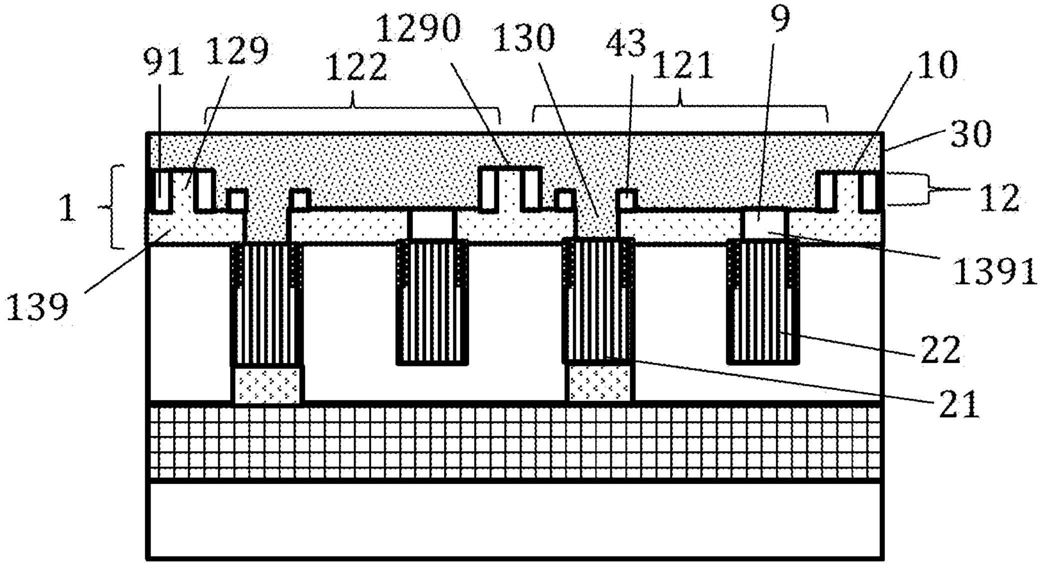

Reference is made to FIG. 15. Thus, when, subsequently, an electrically conductive material 30 is provided 906 (see FIG. 17), e.g., deposited, covering the backside 10, including covering the liner 9, of the substrate 1, the electrically conductive material 30 is deposited in the via 130 electrically contacting the source or drain contact 21 of the first active device, but may not contact the source or drain contact 22 of the second active device as a result of the liner 9 still covering the source or drain contact 22 of the second active device.

The electrically conductive material 30 is also deposited 906 (see FIG. 17) in the regions in the second section 12, e.g., the first 121 and second region 122. In this example, the electrically conductive material 30 is deposited so that the deposited electrically conductive material 30 covers a first end 1290 of the extended shallow trench isolation structures 129, i.e., the regions, e.g., the first 121 and second region 122 are overfilled with the electrically conductive material 30. It may be observed that the part of the first 121 and second region 122 in which electrically conductive material may be deposited, has been slightly narrowed by the liner 9, that, after the anisotropic etch of the liner 9, forms spacers 91 on sides, facing the regions 121, 122, of the extended shallow trench isolation structures 129. In this example, the spacers 91, the template 43 and the liner 9, that is, the part of the liner still remaining after the anisotropic etch, located in the separating portions 1391 between adjacent shallow trench isolation structures 139 may also be present in the integrated circuit device eventually formed.

Reference is made to FIG. 16. Next, grinding, chemical mechanical polishing and/or etch back may be performed such that a backside 300 of the electrically conductive material 30 is coplanar with the first end 1290 of the extended shallow trench isolation structures 129. Thereby, a plurality of buried power rails are formed separated by the extended shallow trench isolation structures 129, including a first buried power rail 31 in the first region and a second buried power rail 32 in the second region, electrically separated from each other by the first extended shallow trench isolation structure 120.

The substrate 1 may, as it comprises buried power rails 31, 32, now be called a back contact layer 1, providing electrical power to the active devices from the backside. As the opening 439 of the template 43 is located in the second section 12, there may be good electrical contact between the first buried power rail 31 and the source or drain contact 21 of the first active device.

The structure formed as such may (e.g., after removal of the carrier wafer 81) be an integrated circuit device 98, or may be an intermediate thereto, in which case the integrated circuit device 98 may be obtained after further processing. For example, the further processing may comprise providing an electrically insulating layer covering the buried power rails 31, 32.

It is to be understood that although some embodiments, specific constructions and configurations, as well as materials, have been discussed herein for devices according to the present disclosure, various changes or modifications in form and detail may be made without departing from the scope of this present disclosure. Steps may be added or deleted to methods described within the scope of the present disclosure.

What is claimed:

1. A method for forming an integrated circuit device, the method comprising:

a) forming a semiconductor device on a frontside of a substrate, the semiconductor device comprising:

a device layer on the frontside of the substrate, the device layer comprising a first active device, and a frontside interconnect layer on a frontside of the device layer, facing away from the substrate, the substrate comprising:

a plurality of shallow trench isolation structures embedded in a substrate material in a first section of the substrate at the frontside of the substrate, wherein adjacent shallow trench isolation structures are separated from each other by a separating portion comprising the substrate material, at least part of a via filled with a sacrificial plug extending through the substrate material in a first separating portion separating adjacent shallow trench isolation structures, and wherein the sacrificial plug contacts a source or drain contact of the first active device;

b) subsequent to forming the semiconductor device, removing the substrate material from a backside of the substrate, thereby exposing the sacrificial plug and the shallow trench isolation structures, and from the separating portions between the adjacent shallow trench isolation structures;

c) thereafter depositing a liner covering the backside of the substrate, thereby covering the sacrificial plug and surfaces of the separating portions, covering exposed surfaces of the device layer facing the separating portions, exposed by said removing of the substrate material;

d) thereafter anisotropically etching the liner so as to expose a first end of the sacrificial plug, while retaining at least part of the liner in the separating portions between adjacent shallow trench isolation structures covering the surfaces of the device layer facing the separating portions;

e) thereafter removing the sacrificial plug selectively with respect to the liner, thereby exposing the source or drain contact of the first active device; and f) thereafter providing an electrically conductive material in the via, electrically contacting the source or drain contact of the first active device, and electrically coupling the electrically conductive material in the via to a buried power rail.

2. The method of claim 1, wherein, after step a) and before step b), the structure comprising the substrate and the semiconductor device is flipped and bonded to a carrier wafer, with the frontside of the substrate facing the carrier wafer.

3. The method according to claim 1, wherein the substrate in step a) comprises at least one extended shallow trench isolation structure embedded in the substrate material in a second section of the substrate, contiguous to the first section and at a side of the first section facing the backside of the substrate, each of the at least one extended shallow trench isolation structure extending from a first end, facing the backside of the substrate, of one of the shallow trench isolation structures, wherein the at least one extended shallow trench isolation structure separates the second section in a plurality of regions comprising the substrate material, wherein each separating portion between adjacent shallow trench isolation structures is located over one of the plurality of regions, wherein, in step b), the substrate material is removed from the second section of the substrate, exposing the at least one extended shallow trench isolation structure, and wherein, in step f), the electrically conductive material is provided in the plurality of regions, thereby forming a plurality of buried power rails.

4. The method according to claim 3, wherein, in step a), the at least one extended shallow trench isolation structure extends farther into the substrate than the sacrificial plug, farther in a direction from the frontside to the backside of the substrate.

5. The method according to claim 3, wherein step f) comprises:

f1) depositing the electrically conductive material so that the deposited electrically conductive material covers a first end of the at least one extended shallow trench isolation structure, facing away from the shallow trench isolation structure from which the at least one extended shallow trench isolation structure extends; and f2) performing at least one of grinding, chemical mechanical polishing or an etch back, such that a backside of the electrically conductive material is coplanar with the first end of the at least one extended shallow trench isolation structure.

6. The method according to claim 3, wherein each of the at least one extended shallow trench isolation structure has a first width (w1), in a direction from a first of both largest opposing surfaces to a second of both largest opposing surfaces, largest by area, of the at least one extended shallow trench isolation structure, that is smaller than a second width (w2), in said direction, of the shallow trench isolation structure from which the at least one extended shallow trench isolation structure extends.

7. The method according to claim 1, wherein, in step a), the device layer comprises a second active device, wherein a source or drain contact of the second active device overlaps with a second separating portion between adjacent shallow trench isolation structures, the second separating portion comprising the substrate material, wherein the source or drain contact of the second active device contacts the substrate material in said second separating portion, wherein in step b), the substrate material is removed from the backside of the substrate, from said second separating portion between adjacent shallow trench isolation structures, thereby exposing the source or drain contact of the second active device, wherein, in step c), the liner is deposited filling the second separating portion, thereby covering the exposed source or drain contact of the second active device, and wherein, in step d), the anisotropically etching the liner is performed such that the source or drain contact of the second active device remains covered by the liner.

8. The method according to claim 1, wherein the liner deposited in step c) has a thickness that is at least as large as half of a distance separating adjacent shallow trench isolation structures.

9. The method according to claim 1, wherein step a) of forming the semiconductor device on the frontside of the substrate comprises forming the plurality of shallow trench isolation structures in the substrate by:

a1) forming a plurality of trenches through the frontside of the substrate; and a2) depositing an electrically insulating material in the trenches, thereby forming the plurality of shallow trench isolation structures.

10. The method of claim 9, further forming the via and the source or drain contact of the first active device in the substrate by:

a3) removing part of the substrate material in the first separating portion separating adjacent shallow trench isolation structures so as to form a hole defining the via;

a4) depositing a sacrificial material in the via so as to form the sacrificial plug; and a5) forming the source or drain contact of the first active device on the sacrificial plug.

11. An integrated circuit device, comprising:

a semiconductor device comprising:

a device layer on a frontside of a substrate, the device layer comprising a first active device, and a frontside interconnect layer on a frontside of the device layer, facing away from the substrate, the substrate comprising:

a plurality of shallow trench isolation structures in a first section of the substrate at the frontside of the substrate, wherein adjacent shallow trench isolation structures are separated from each other by a separating portion, wherein a liner material covers surfaces of the device layer facing the separating portions, wherein a via, comprising an electrically conductive material, electrically couples a source or drain contact of the first active device to a first buried power rail, and wherein at least part of the via is located in a first separating portion separating adjacent shallow trench isolation structures.

12. The integrated circuit device according to claim 11, wherein the substrate comprises at least one extended shallow trench isolation structure in a second section of the substrate, contiguous to the first section and at a side of the first section facing a backside of the substrate, each of the at least one extended shallow trench isolation structure extending from a first end of one of the shallow trench isolation structures, the first end facing the backside of the substrate, wherein the at least one extended shallow trench isolation structure separates the first buried power rail from a second buried power rail.

13. The integrated circuit device according to claim 12, wherein a longitudinal axis of each of the at least one extended shallow trench isolation structure is parallel to a longitudinal axis of the shallow trench isolation structure from which the at least one extended shallow trench isolation structure extends.

14. The integrated circuit device according to claim 13, wherein a width of the first buried power rail, in a direction from a first to a second of two adjacent shallow trench isolation structures, is at least 50 nm.

15. The integrated circuit device according to claim 11, wherein the first active device is a field effect transistor.

16. The integrated circuit device according to claim 15, wherein the field effect transistor comprises a nanosheet field effect transistor, a complementary field effect transistor, or a fin field effect transistor.

* * * * *